United States Patent
Sai

(10) Patent No.: US 11,784,220 B2
(45) Date of Patent: Oct. 10, 2023

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Hideaki Sai, Ibo Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/470,625

(22) Filed: Sep. 9, 2021

(65) Prior Publication Data
US 2022/0208969 A1 Jun. 30, 2022

(30) Foreign Application Priority Data

Dec. 25, 2020 (JP) .................................. 2020-216800
Aug. 25, 2021 (JP) .................................. 2021-137447

(51) Int. Cl.
*H01L 29/08* (2006.01)
*H01L 27/02* (2006.01)
*H01L 29/87* (2006.01)

(52) U.S. Cl.
CPC ...... *H01L 29/0834* (2013.01); *H01L 27/0248* (2013.01); *H01L 29/0839* (2013.01); *H01L 29/87* (2013.01)

(58) Field of Classification Search
CPC ............ H01L 27/0248; H01L 27/0262; H01L 29/0692; H01L 29/0834; H01L 29/0839; H01L 29/417; H01L 29/87
See application file for complete search history.

(56) References Cited

U.S. PATENT DOCUMENTS

| 10,032,762 B1 | 7/2018 | Sai | |
|---|---|---|---|
| 2011/0212595 A1* | 9/2011 | Hu | H01L 21/761 438/430 |
| 2012/0068299 A1* | 3/2012 | Lin | H01L 29/8613 257/E27.12 |

FOREIGN PATENT DOCUMENTS

| JP | 2007-116053 A | 5/2007 |
| JP | 2014-167870 A | 9/2014 |
| JP | 2018-160626 A | 10/2018 |

* cited by examiner

*Primary Examiner* — Meiya Li
(74) *Attorney, Agent, or Firm* — Allen & Overy LLP

(57) ABSTRACT

A semiconductor device includes: a semiconductor layer of a first conductivity type; a first electrode located on the semiconductor layer; a second electrode located on the semiconductor layer; a third electrode located on the semiconductor layer between the first electrode and the second electrode, and separated from them; a first semiconductor region that is located in the semiconductor layer and is of a second conductivity type; a first cathode region of the first conductivity type; a first anode region of the second conductivity type; a second cathode region of the first conductivity type; a second anode region of the second conductivity type; a third anode region of the second conductivity type; a third cathode region of the first conductivity type; a second semiconductor region of the second conductivity type; a fourth anode region of the second conductivity type; and a fourth cathode region of the first conductivity type.

6 Claims, 18 Drawing Sheets

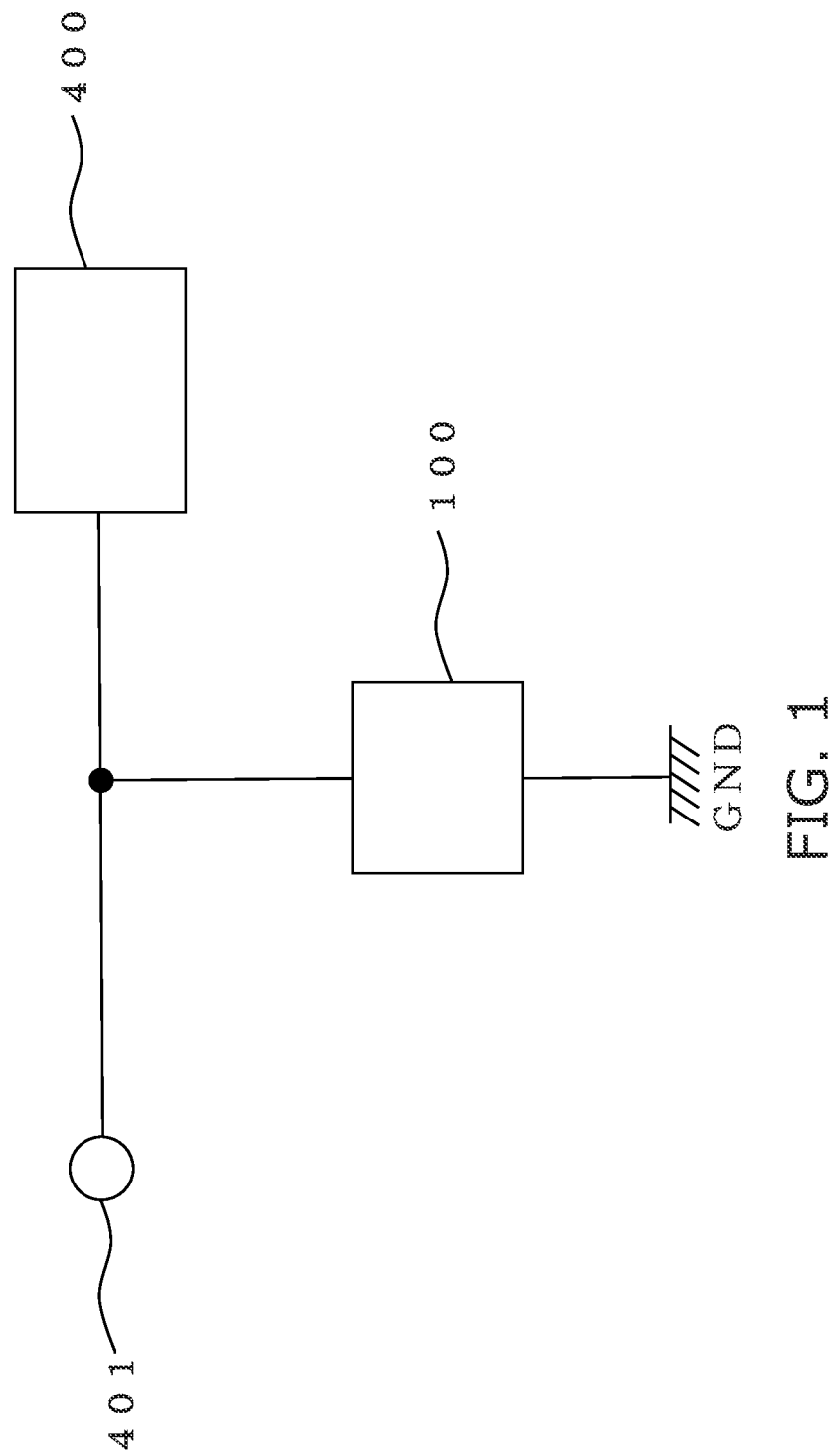

SEMICONDUCTOR DEVICE

CROSS-REFERENCE TO RELATED APPLICATIONS

This application is based upon and claims the benefit of priority from Japanese Patent Application No. 2020-216800, filed on Dec. 25, 2020, and Japanese Patent Application No. 2021-137447, filed on Aug. 25, 2021; the entire contents of which are incorporated herein by reference.

FIELD

Embodiments relate to a semiconductor device.

BACKGROUND

An ESD protection diode is provided in an electronic circuit to protect the electronic circuit from electrostatic discharge (ESD).

A low operating voltage and a low operating internal resistance (dynamic resistance) are examples of desirable characteristics of the ESD protection diode.

BRIEF DESCRIPTION OF THE DRAWINGS

FIG. 1 is a circuit diagram showing a usage example of a semiconductor device 100 according to a first embodiment;

DETAILED DESCRIPTION

Figure 2A:
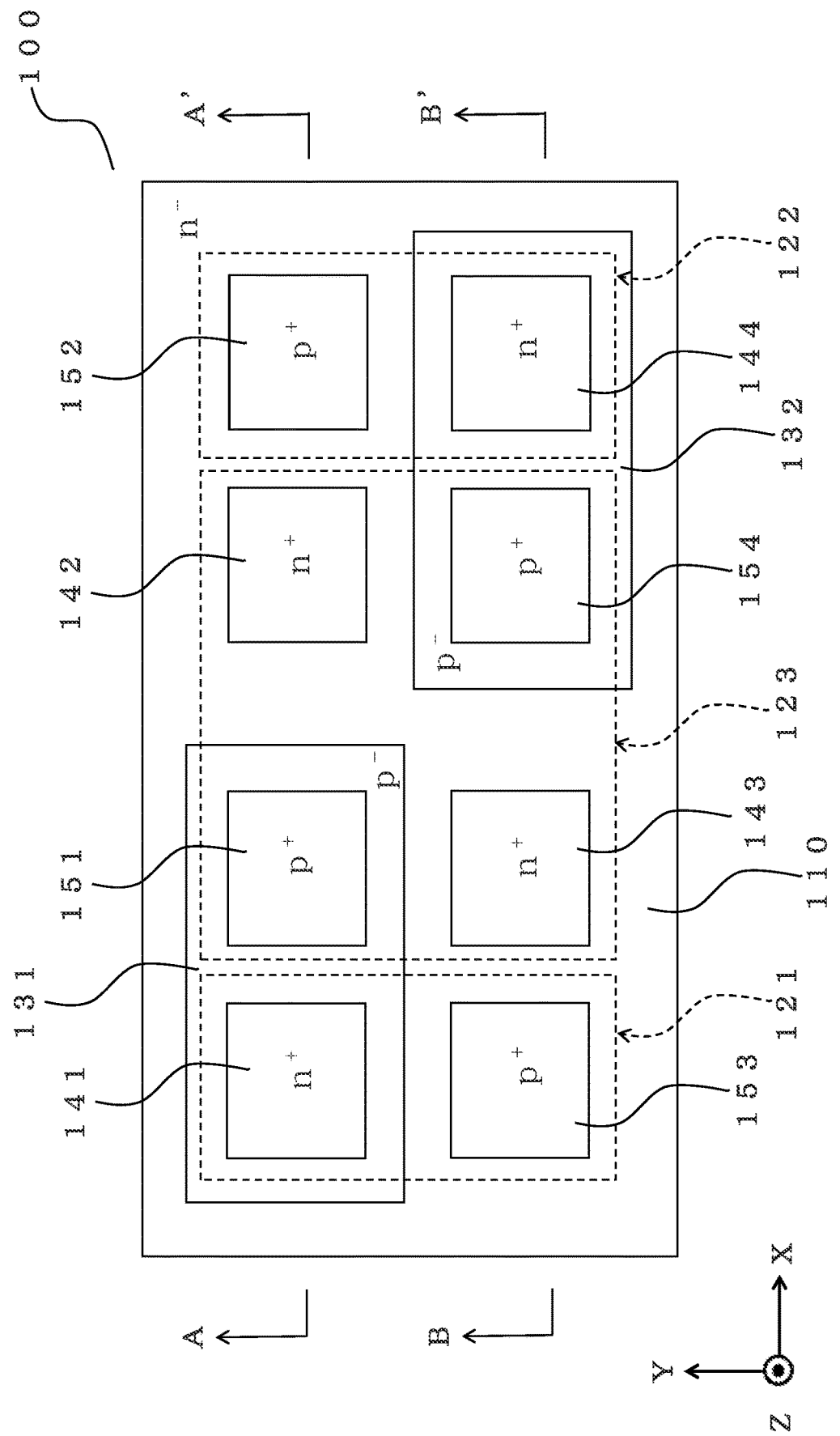
FIG. 2A is a plan view of the semiconductor device 100 according to the first embodiment.

A semiconductor device of an embodiment includes: a semiconductor layer of a first conductivity type; a first electrode located on the semiconductor layer; a second electrode located on the semiconductor layer; a third electrode that is located on the semiconductor layer between the first electrode and the second electrode, and is separated from the first and second electrodes; a first semiconductor region that is located in the semiconductor layer and is of a second conductivity type; a first cathode region that is located in the first semiconductor region, is of the first conductivity type, and is connected with the first electrode; a first anode region that is located in the first semiconductor region, is of the second conductivity type, and is connected with the third electrode; a second cathode region that is located in the semiconductor layer, is of the first conductivity type, is separated from the first semiconductor region in a first direction, and is connected with the third electrode, wherein the first direction is from the first electrode toward the second electrode; a second anode region that is located in the semiconductor layer, is of the second conductivity type, and is connected with the second electrode; a third anode region that is located in the semiconductor layer, is of the second conductivity type, and is connected with the first electrode; a third cathode region that is located in the semiconductor layer, is of the first conductivity type, and is connected with the third electrode; a second semiconductor region that is located in the semiconductor layer, is of the second conductivity type, and is separated from the first cathode region and separated from the first semiconductor region in the first direction; a fourth anode region that is located in the second semiconductor region, is of the second conductivity type, and is connected with the third electrode; and a fourth cathode region that is located in the second semiconductor region, is of the first conductivity type, and is connected with the second electrode.

Embodiments of the invention will now be described with reference to the drawings. Common portions in all of the drawings of the description are marked with common reference numerals. The dimensional ratios of the drawings are not limited to the illustrated ratios. The embodiments do not limit the invention.

First Embodiment

For example, a semiconductor device 100 of a first embodiment is used as a protection circuit that protects an electronic circuit 400 from ESD. A usage example of the semiconductor device 100 is described with reference to FIG. 1. FIG. 1 is a circuit diagram showing the usage example of the semiconductor device 100 according to the first embodiment. One end of the semiconductor device 100 is connected between the electronic circuit 400 and an external terminal 401. The other end of the semiconductor device 100 is connected to a ground potential GND. When an excessive positive voltage that is greater than the voltage normally applied to the electronic circuit 400 is applied to the external terminal 401, a current flows from the external terminal 401 toward the ground potential GND via the semiconductor device 100. On the other hand, when an excessive negative voltage is applied to the external terminal

401, a current flows from the ground potential GND toward the external terminal 401 via the semiconductor device 100. As described above, the semiconductor device 100 has the function of protecting the electronic circuit 400 from an overvoltage caused by noise such as ESD input to the external terminal 401, etc.

Structure of Semiconductor Device 100

Figure 2B:
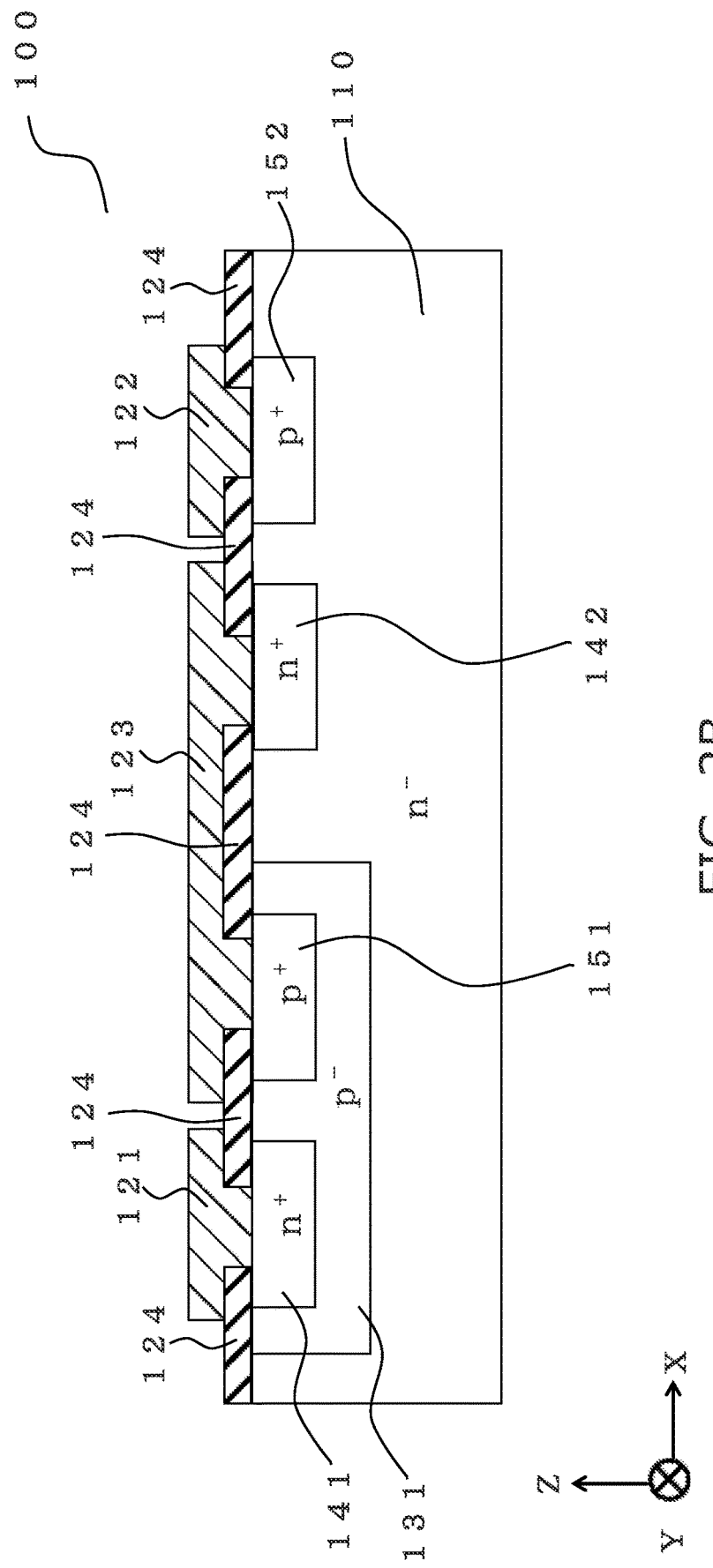
FIG. 2B is a cross-sectional view along line A-A' shown in FIG. 2A.
Figure 2C:
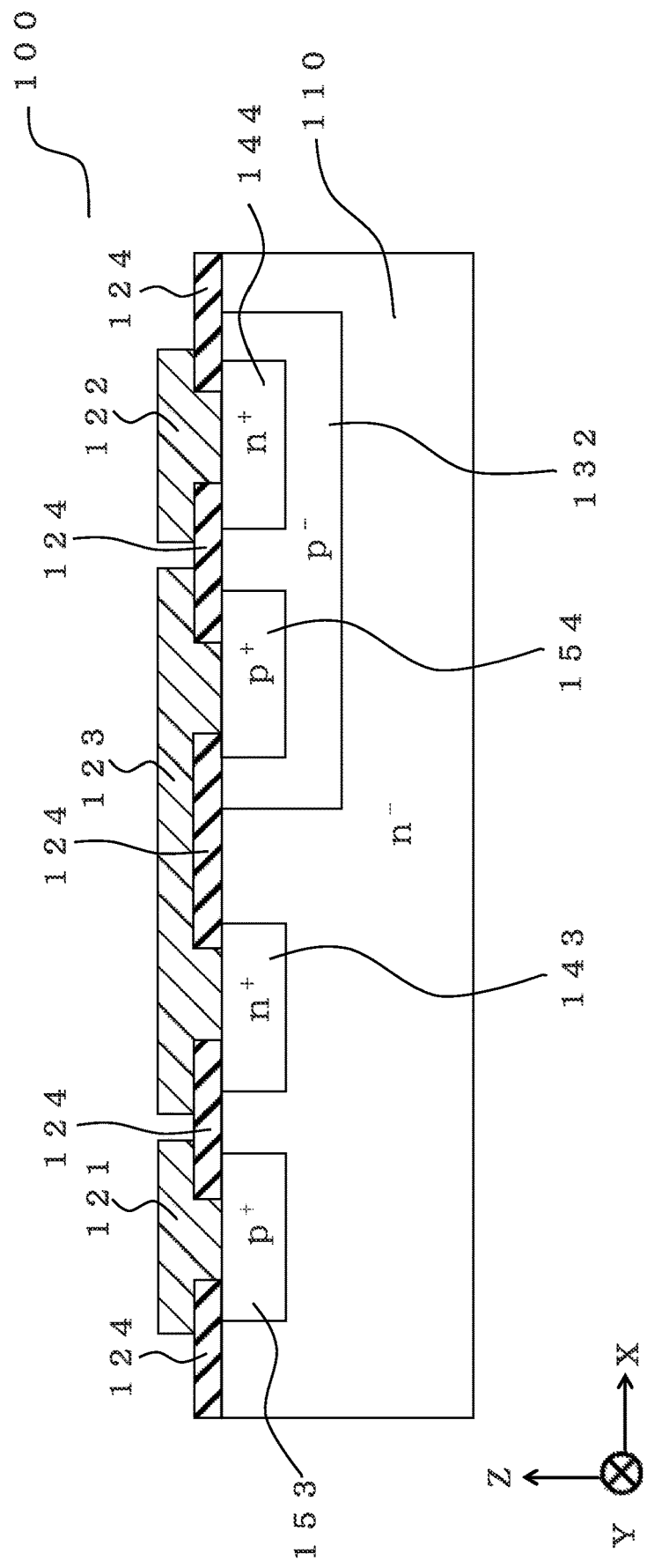
FIG. 2C is a cross-sectional view along line B-B' shown in FIG. 2A.

A detailed structure of the semiconductor device 100 according to the first embodiment will now be described with reference to FIGS. 2A to 2C. FIG. 2A is a plan view of the semiconductor device 100 according to the first embodiment; FIG. 2B is a cross-sectional view along line A-A' shown in FIG. 2A; and FIG. 2C is a cross-sectional view along line B-B' shown in FIG. 2A.

In the following example, the first conductivity type is an n-type; and the second conductivity type is a p-type. In the following description, the notations of $n^+$, n, $n^-$, $p^+$, p, and $p^-$ indicate relative levels of the impurity concentrations of the conductivity types. In other words, $n^+$ indicates that the n-type impurity concentration is relatively higher than that of n; and $n^-$ indicates that the n-type impurity concentration is relatively lower than that of n. Also, $p^+$ indicates that the p-type impurity concentration is relatively higher than that of p; and $p^-$ indicates that the p-type impurity concentration is relatively lower than that of p. The $n^+$-type and the $n^-$-type may be recited as simply the n-type; and the $p^+$-type and the $p^-$-type may be recited simply as the p-type.

The semiconductor device 100 includes an $n^-$-type semiconductor layer 110, a first electrode 121, a second electrode 122, a third electrode 123, an insulating layer 124, a $p^-$-type first semiconductor region 131, a $p^-$-type second semiconductor region 132, an $n^+$-type first cathode region 141, an $n^+$-type second cathode region 142, an $n^+$-type third cathode region 143, an $n^+$-type fourth cathode region 144, a $p^+$-type first anode region 151, a $p^+$-type second anode region 152, a $p^+$-type third anode region 153, and a $p^+$-type fourth anode region 154.

In FIG. 2A, the first electrode 121, the second electrode 122, and the third electrode 123 are shown by broken lines; and the insulating layer 124 is not illustrated.

As an example, the $n^-$-type semiconductor layer 110 is formed by epitaxially growing, for example, silicon (Si) on a not-illustrated substrate.

The first electrode 121, the second electrode 122, and the third electrode 123 are located on the $n^-$-type semiconductor layer 110.

The direction from the first electrode 121 toward the second electrode 122 is taken as an X-direction (a first direction). A direction orthogonal to the X-direction is taken as a Y-direction (a second direction); and a direction orthogonal to the X-direction and the Y-direction is taken as a Z-direction (a third direction). The semiconductor device 100 shown in FIG. 2A is a plan view in the X-Y plane; and the semiconductor device 100 shown in FIG. 2B is a cross-sectional view in the X-Z plane. Although the X-direction, the Y-direction, and the Z-direction according to the embodiment have an orthogonal relationship, the relationship is not limited to orthogonal; it is sufficient for the directions to cross each other.

The third electrode 123 is positioned between the first electrode 121 and the second electrode 122 in the X-direction and is separated from the first and second electrodes 121 and 122.

For example, the first electrode 121, the second electrode 122, and the third electrode 123 are made of aluminum (Al). The first electrode 121, the second electrode 122, and the third electrode 123 are formed by sputtering and etching Al.

The $p^-$-type first semiconductor region 131 and the $p^-$-type second semiconductor region 132 are located in the $n^-$-type semiconductor layer 110. The first semiconductor region 131 is connected with the first and third electrodes 121 and 123. The second semiconductor region 132 is connected with the second and third electrodes 122 and 123. The first semiconductor region 131 and the second semiconductor region 132 are separated from each other in the X-Y plane.

The $n^+$-type first cathode region 141 and the $p^+$-type first anode region 151 are located in the first semiconductor region 131 and are next to each other in the X-direction. The first cathode region 141 is electrically connected with the first electrode 121 in the Z-direction. The first anode region 151 is electrically connected with the third electrode 123 in the Z-direction.

The $n^+$-type second cathode region 142 and the $p^+$-type second anode region 152 are located in the $n^-$-type semiconductor layer 110 and are next to each other in the X-direction. The second cathode region 142 is separated from the first semiconductor region 131 in the X-direction and is electrically connected with the third electrode 123 in the Z-direction. The second anode region 152 is electrically connected with the second electrode 122 in the Z-direction.

As described above, the first cathode region 141, the first anode region 151, the second cathode region 142, and the second anode region 152 are arranged in the X-direction in this order. The first anode region 151 and the second cathode region 142 are electrically connected via the third electrode 123.

The $p^+$-type third anode region 153 and the $n^+$-type third cathode region 143 are located in the $n^-$-type semiconductor layer 110 and are next to each other in the X-direction. The third anode region 153 and the third cathode region 143 are separated from the first cathode region 141 and the first anode region 151 and are arranged with the first cathode region 141 and the first anode region 151 in the Y-direction. The third anode region 153 is electrically connected with the first electrode 121 in the Z-direction. The third cathode region 143 is separated from the second semiconductor region 132 in the X-direction and is electrically connected with the third electrode 123 in the Z-direction.

The $p^+$-type fourth anode region 154 and the $n^+$-type fourth cathode region 144 are located in the second semiconductor region 132 and are next to each other in the X-direction. The fourth anode region 154 is electrically connected with the third electrode 123 in the Z-direction. The fourth cathode region 144 is electrically connected with the second electrode 122 in the Z-direction.

As described above, the third anode region 153, the third cathode region 143, the fourth anode region 154, and the fourth cathode region 144 are arranged in the X-direction in this order. The third cathode region 143 and the fourth anode region 154 are electrically connected via the third electrode 123.

For example, the first cathode region 141, the first anode region 151, the second cathode region 142, the second anode region 152, the third cathode region 143, the third anode region 153, the fourth cathode region 144, and the fourth anode region 154 are formed by burying impurity diffusion layers.

The n-type impurity that is used in the semiconductor device 100 is, for example, phosphorus (P). The p-type impurity that is used in the semiconductor device 100 is, for example, boron (B). An "n-type impurity" refers to an impurity that forms donors when included in a semiconductor material, e.g., silicon (Si), that forms the semiconductor layer 110. A "p-type impurity" refers to an impurity that forms acceptors when included in the semiconductor material that forms the semiconductor layer 110.

The insulating layer 124 is located at a portion between the first electrode 121 and the first semiconductor region 131, a portion between the first electrode 121 and the first cathode region 141, a portion between the third electrode 123 and the first anode region 151, a portion between the third electrode 123 and the n⁻-type semiconductor layer 110, a portion between the third electrode 123 and the second cathode region 142, a portion between the second electrode 122 and the second anode region 152, a portion between the first electrode 121 and the third anode region 153, a portion between the third electrode 123 and the third cathode region 143, a portion between the third electrode 123 and the second semiconductor region 132, a portion between the third electrode 123 and the fourth anode region 154, and a portion between the second electrode 122 and the fourth cathode region 144. The insulating layer 124 electrically insulates between the electrodes and the semiconductor regions described above and between the third electrode and the semiconductor regions.

Operation of Semiconductor Device 100

Figure 3:
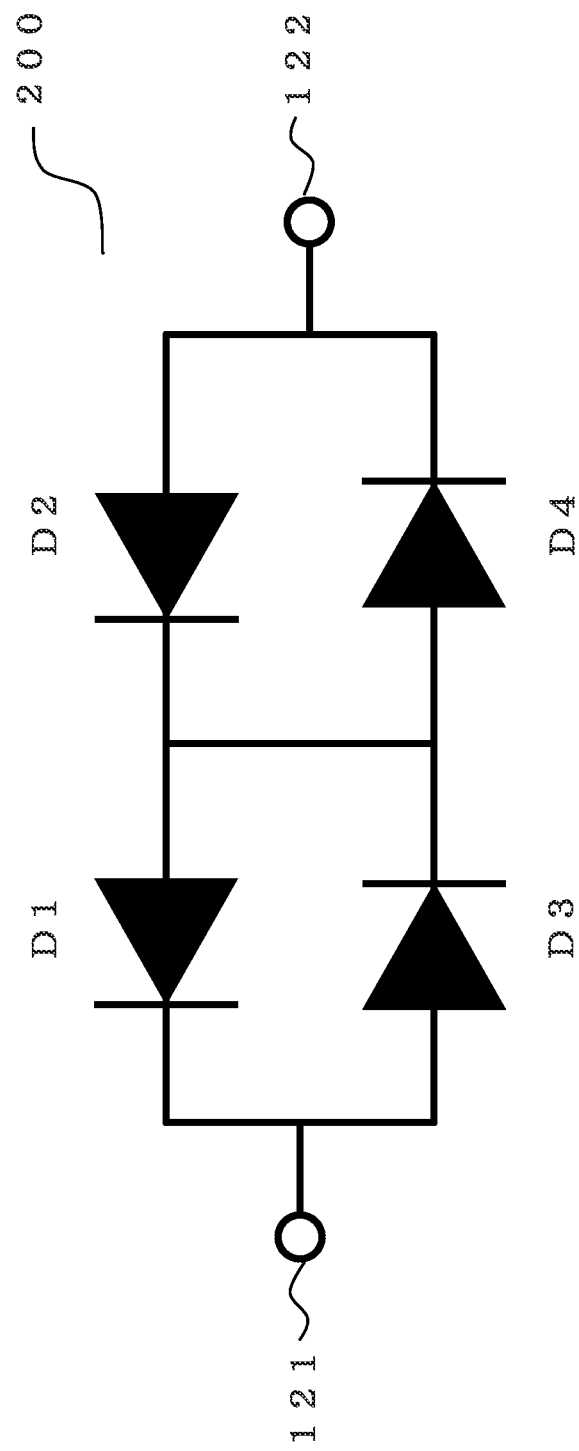
FIG. 3 is an equivalent circuit 200 of the semiconductor device according to the first embodiment.

An equivalent circuit according to the first embodiment will now be described using FIG. 3. FIG. 3 shows an equivalent circuit 200 of the semiconductor device 100 according to the first embodiment.

The semiconductor device 100 has a structure such as that described above; and a diode D1 is made of the n⁺-type first cathode region 141 and the p⁻-type first semiconductor region 131 (including the p⁺-type first anode region 151). Similarly, a diode D2 is made of the p⁺-type second anode region 152 and the n⁻-type semiconductor layer 110 (including the n⁺-type second cathode region 142). Also, a diode D3 is made of the third anode region 153 and the n⁻-type semiconductor layer 110 (including the n⁺-type third cathode region 143). Furthermore, a diode D4 is made of the n⁺-type fourth cathode region 144 and the p⁻-type second semiconductor region 132 (including the n⁺-type fourth anode region 154). Therefore, the equivalent circuit of the semiconductor device 100 includes a bidirectional circuit such as that shown in FIG. 3 in which a current flows from the first electrode 121 to the second electrode 122 via the diodes D3 and D4 and a current flows from the second electrode 122 to the first electrode 121 via the diodes D2 and D1.

Specifically, the current that is input to the first electrode 121 flows in the X-direction in the order of the third anode region 153 and the n⁻-type semiconductor layer 110, subsequently reaches the third cathode region 143, and flows toward the third electrode 123. The current that passes through the third electrode 123 flows toward the fourth anode region 154, passes through the second semiconductor region 132 in the X-direction, subsequently reaches the fourth cathode region 144, and is output to the second electrode 122.

On the other hand, the current that is input to the second electrode 122 flows in the X-direction in the order of the second anode region 152 and the n⁻-type semiconductor layer 110, subsequently reaches the second cathode region 142, and flows toward the third electrode 123. The current that passes through the third electrode 123 flows toward the first anode region 151, passes through the first semiconductor region 131 in the X-direction, subsequently reaches the first cathode region 141, and is output to the first electrode 121.

Accordingly, in the equivalent circuit of the semiconductor device 100 shown in FIG. 3, the current that is input to the first electrode 121 passes through in the order of the diode D3 (the forward direction) and the diode D4 (the forward direction), and is output to the second electrode 122. On the other hand, the current that is input to the second electrode 122 passes through in the order of the diode D2 (the forward direction) and the diode D1 (the forward direction), and is output to the first electrode 121.

Effects of First Embodiment

Figure 4:
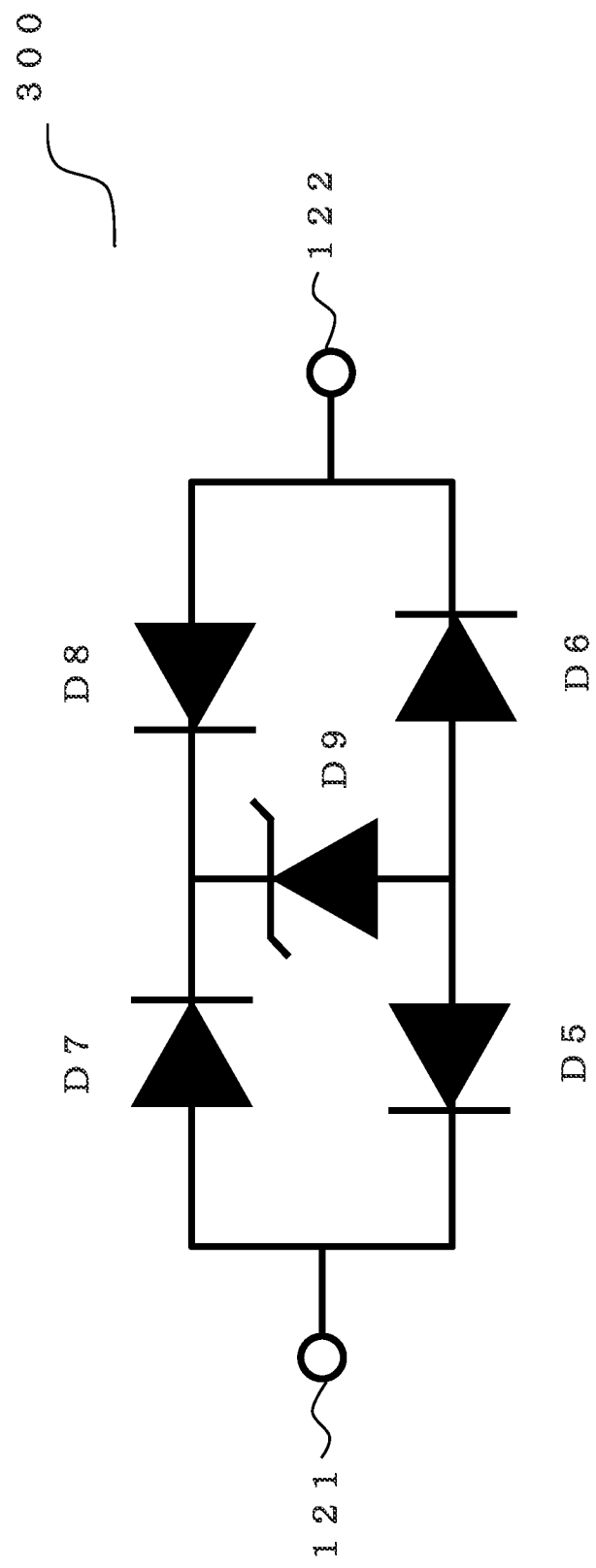
FIG. 4 is an equivalent circuit 300 of a semiconductor device according to a comparative example.

Effects of the semiconductor device 100 of the first embodiment will now be described using an equivalent circuit 300 of the semiconductor device of the comparative example. FIG. 4 shows the equivalent circuit 300 of the semiconductor device of the comparative example. The same portions as those of the semiconductor device 100 of the first embodiment are marked with the same reference numerals.

The structure of the semiconductor device of the comparative example will now be described. The anode of a diode D7 is connected to the first electrode 121. A diode D8 is connected in series to the diode D7; and the cathode of the diode D7 and the cathode of the diode D8 are connected. The anode of the diode D8 is connected with the second electrode 122.

The cathode of a diode D5 also is connected to the first electrode 121. A diode D6 is connected in series to the diode D5; and the anode of the diode D5 and the anode of the diode D6 are connected. The cathode of the diode D6 is connected with the second electrode 122.

The cathode of a diode D9 that is a Zener diode is connected to the cathode of the diode D7 and the cathode of the diode D8. The anode of the diode D9 is connected to the anode of the diode D5 and the anode of the diode D6.

In the equivalent circuit 300 of the semiconductor device of the comparative example, the current that is input to the first electrode 121 passes through in the order of the diode D7 (the forward direction), the diode D9 (the reverse direction), and the diode D6 (the forward direction), and is output to the second electrode 122. On the other hand, the current that is input to the second electrode 122 passes through in the order of the diode D8 (the forward direction), the diode D9 (the reverse direction), and the diode D5 (the forward direction), and is output to the first electrode 121. The current always passes through the diode D9 (the reverse direction) no matter which path, that is, when the current flows from the first electrode 121 to the second electrode 122, and when the current flows from the second electrode 122 to the first electrode 121.

Here, the reverse voltage is greater than the forward voltage when passing through the diode. For example, the forward voltage is 0.75 V; and the reverse voltage is 2 V. Therefore, in the semiconductor device of the comparative example, the total voltage is 3.5 V when the current flows in the order of the diode D7 (the forward direction: 0.75 V), the diode D9 (the reverse direction: 2 V), and the diode D6 (the forward direction: 0.75 V). Similarly, in the semiconductor device of the comparative example, the total voltage also is 3.5 V when the current flows in the order of the diode D8 (the forward direction: 0.75 V), the diode D9 (the reverse direction: 2 V), and the diode D5 (the forward direction: 0.75 V).

As described using FIG. 1, the semiconductor device of the comparative example and the semiconductor device of the first embodiment are used as protection circuits that protect the electronic circuit 400 from ESD. For example, there are cases where the voltage that is applied in the normal operation of the electronic circuit 400 is small, e.g., not more than 1 V. In such a case, the operating voltage that is necessary for an ESD protection circuit also is small; therefore, a structure such as that of the semiconductor device of the comparative example in which the threshold is not less than 3.5 V is unsuitable. For example, when ESD of 3 V is applied, there is a possibility that the electronic circuit 400 may be damaged without the semiconductor device of the comparative example conducting.

On the other hand, in the semiconductor device 100 of the first embodiment, the reverse voltage is not applied because the current does not pass through a reverse diode when passing through each path. For example, when the forward voltage of the diode is 0.75 V and the reverse voltage is 2 V, the total is 1.5 V when passing through any path; and the voltage can be less than that of the semiconductor device of the comparative example. For example, when ESD of 3 V is applied, the semiconductor device 100 of the first embodiment conducts, and the electronic circuit 400 can be protected. On the other hand, the semiconductor device 100 does not conduct even when the voltage that is applied in the normal operation of the electronic circuit 400 (e.g., not more than 1 V) is applied to the semiconductor device 100; therefore, the operation of the electronic circuit 400 is not affected.

Because the lower voltage described above is possible, the ESD protection diode is applicable to applications requiring a lower voltage, e.g., signal lines.

Also, the parasitic capacitance of the diodes in the semiconductor device 100 of the first embodiment can be reduced by the series connection of the diodes D1 and D2 and the series connection of the diodes D3 and D4.

In the semiconductor device 100 of the first embodiment, each pair of regions, i.e., the first cathode region 141 and the first anode region 151, the second cathode region 142 and the second anode region 152, the third cathode region 143 and the third anode region 153, and the fourth cathode region 144 and the fourth anode region 154, is arranged parallel to the X-direction; therefore, the current flows in the X-direction, and substantially does not flow in the Z-direction. Therefore, compared to a conventional semiconductor device in which an anode region and a cathode region are arranged in the Z-direction and the current flows in the Z-direction, the current path is shorter, and the internal resistance (the dynamic resistance) when operating the semiconductor device can be reduced.

Modification of First Embodiment

Figure 5A:
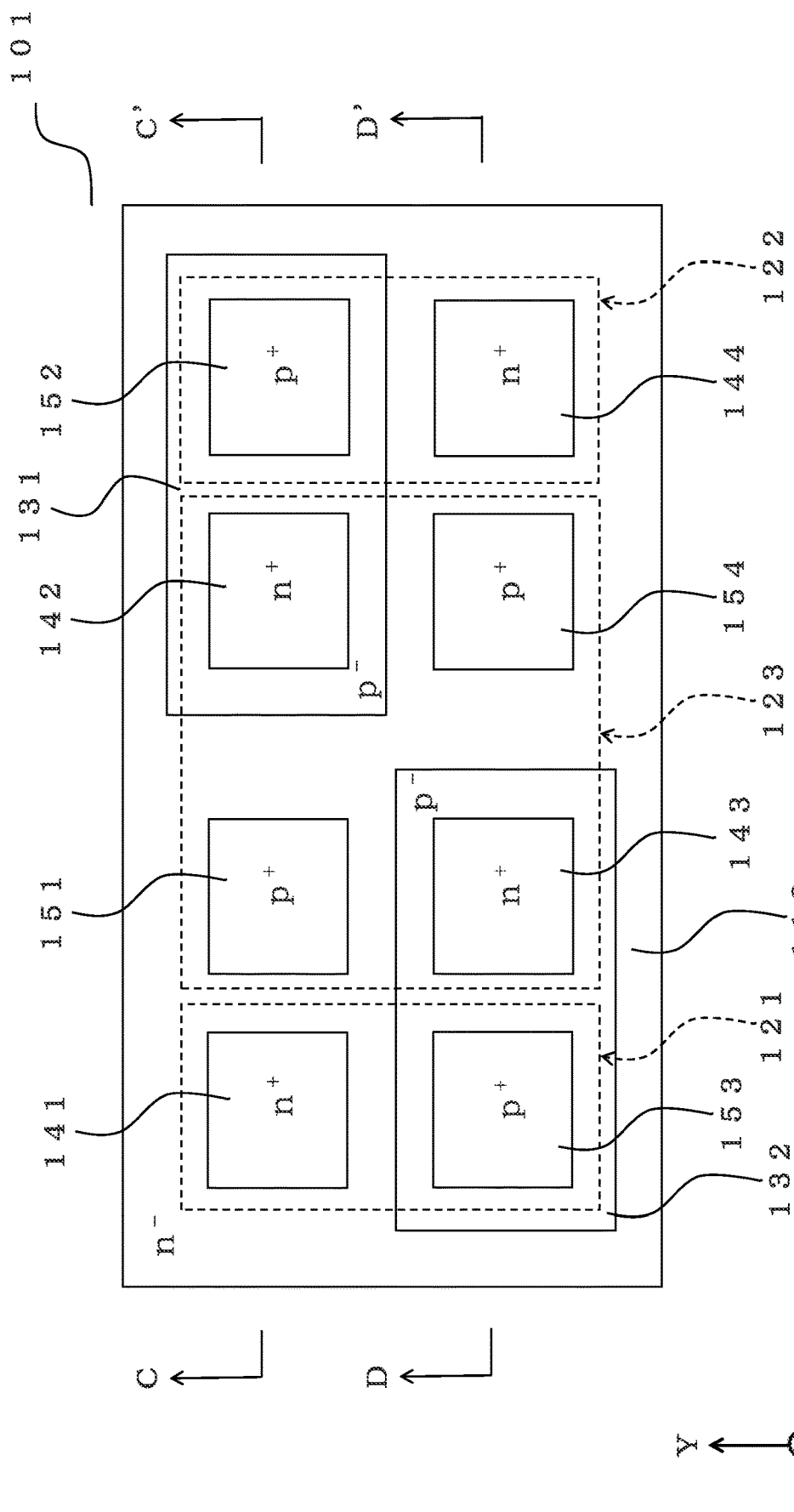
FIG. 5A is a plan view of a semiconductor device 101 according to a modification of the first embodiment.
Figure 5B:
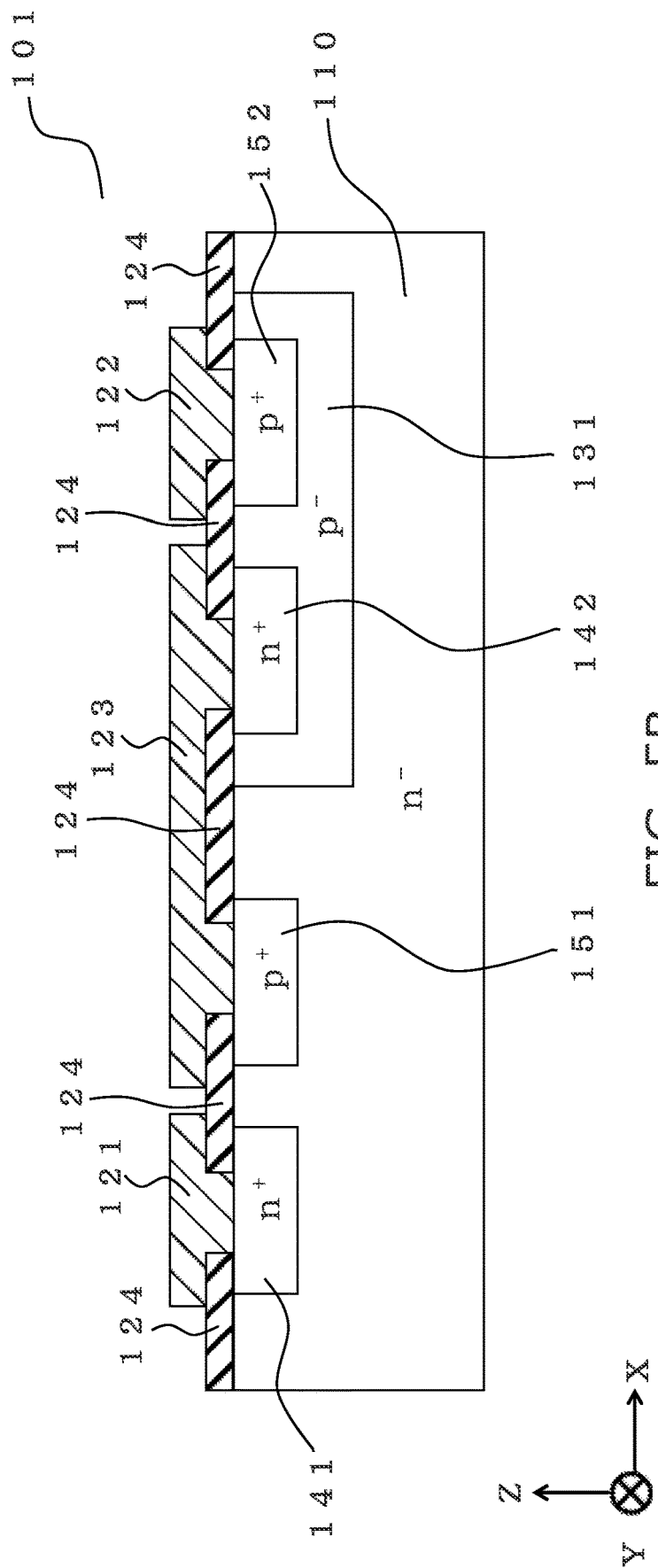
FIG. 5B is a cross-sectional view along line C-C' shown in FIG. 5A.
Figure 5C:
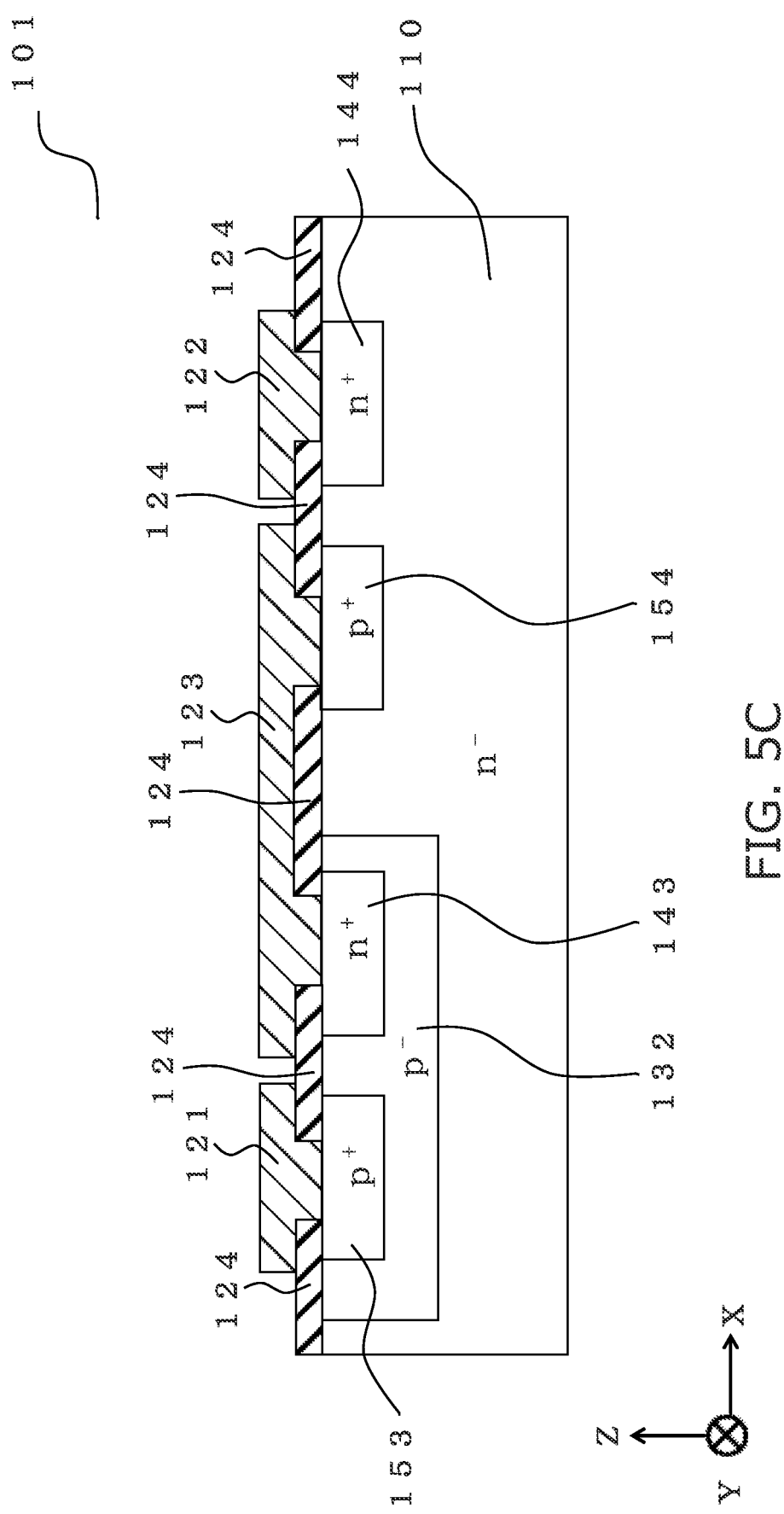
FIG. 5C is a cross-sectional view along line D-D' shown in FIG. 5A.

A semiconductor device 101 according to a modification of the first embodiment will now be described with reference to FIGS. 5A to 5C. FIG. 5A is a plan view of the semiconductor device 101 according to the modification of the first embodiment; FIG. 5B is a cross-sectional view along line C-C' shown in FIG. 5A; and FIG. 5C is a cross-sectional view along line D-D' shown in FIG. 5A. The same portions as those of the semiconductor device 100 of the first embodiment are marked with the same reference numerals.

The semiconductor device 101 according to the modification of the first embodiment differs from the semiconductor device 100 of the first embodiment in that the second cathode region 142 and the second anode region 152 are located in the first semiconductor region 131; and the third cathode region 143 and the third anode region 153 are located in the second semiconductor region 132. The first cathode region 141, the first anode region 151, the fourth cathode region 144, and the fourth anode region 154 are located in the n⁻-type semiconductor layer 110. Comparing the semiconductor device 101 according to the modification to the semiconductor device 100 of the first embodiment, only the positions of the first and second semiconductor regions 131 and 132 are changed; the positional relationship of the first cathode region 141, the first anode region 151, the second cathode region 142, the second anode region 152, the third cathode region 143, the third anode region 153, the fourth cathode region 144, the fourth anode region 154, the first electrode 121, the second electrode 122, and the third electrode 123 is unchanged.

Effects similar to those of the semiconductor device 100 of the first embodiment are obtained according to the modification of the first embodiment as well.

Although the first conductivity type is the n-type and the second conductivity type is the p-type in the description of the first embodiment and modifications of the first embodiment described above, similar effects can be obtained by setting the first conductivity type to be the p-type and the second conductivity type to be the n-type.

Second Embodiment

Figure 6A:
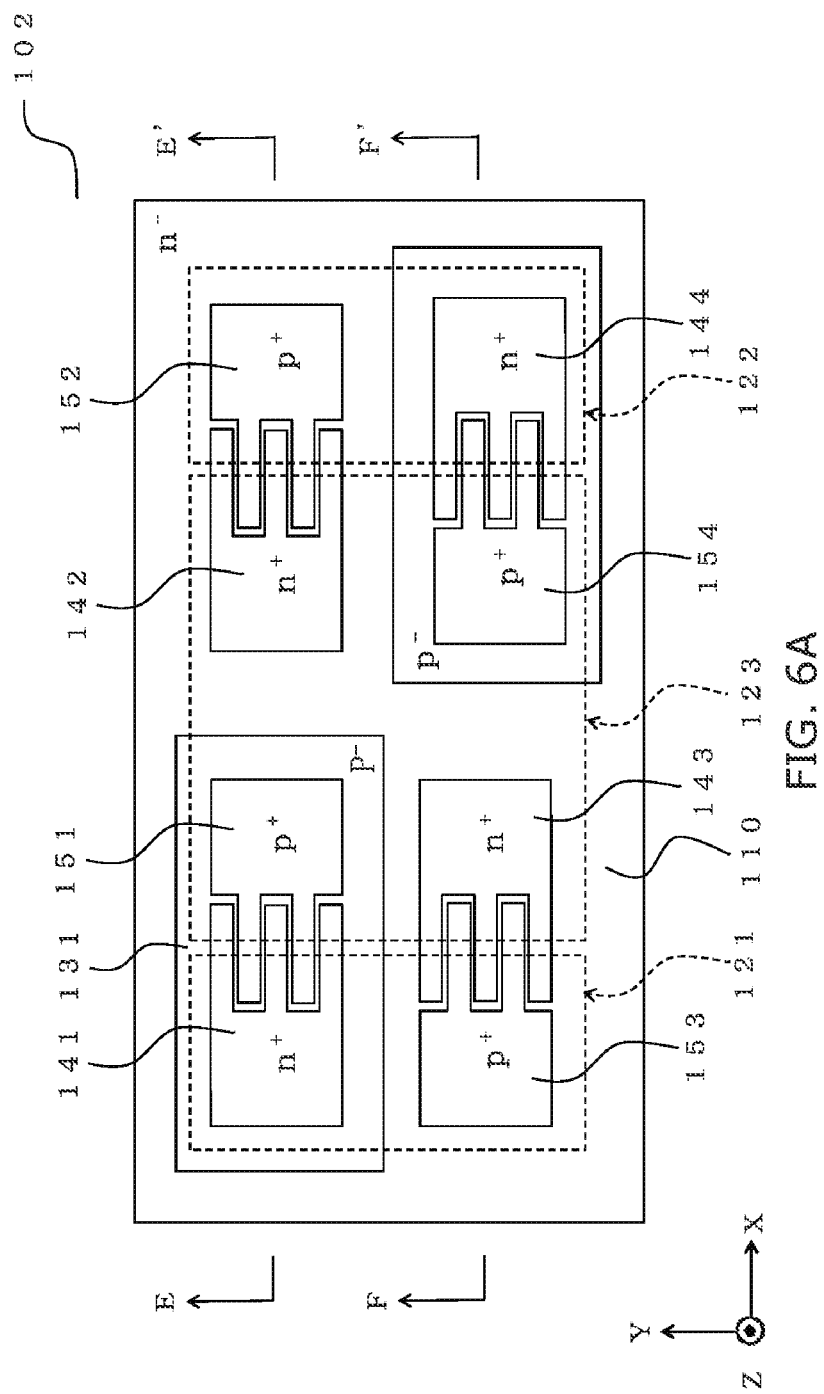
FIG. 6A is a plan view of a semiconductor device 102 according to a second embodiment.
Figure 6B:
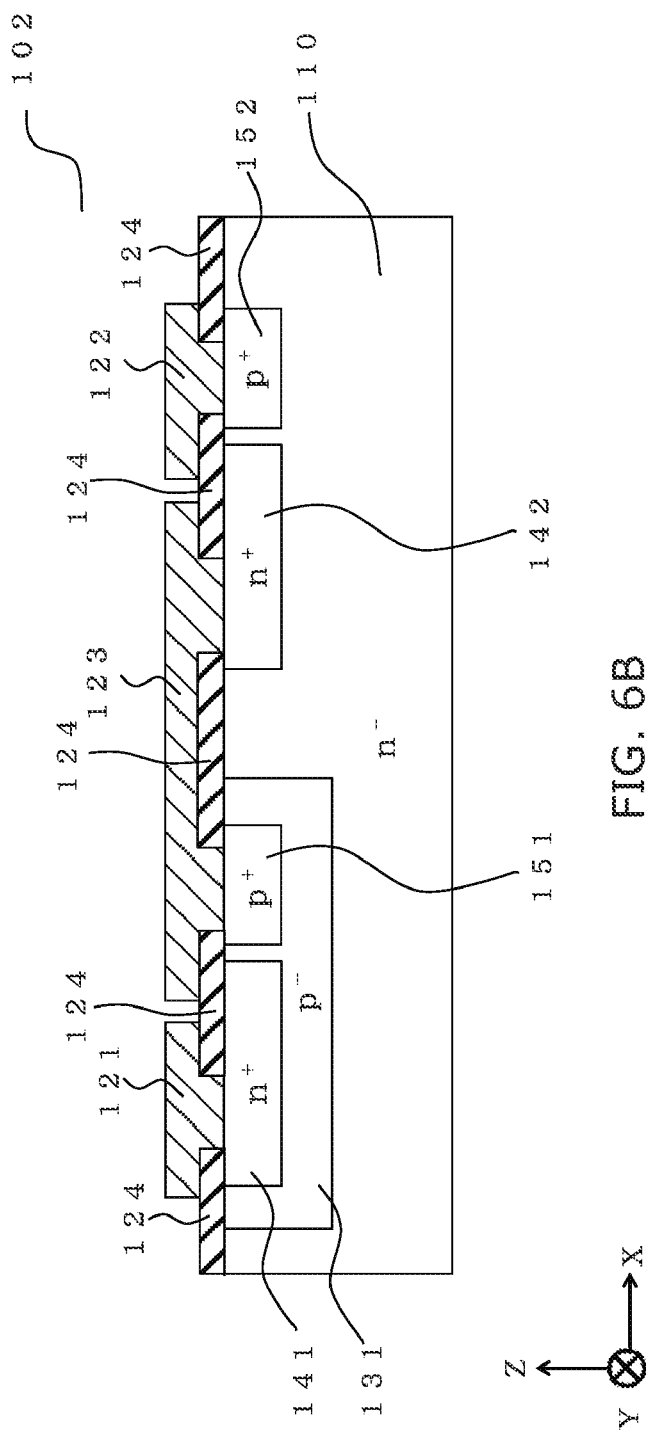
FIG. 6B is a cross-sectional view along line E-E' shown in FIG. 6A.
Figure 6C:
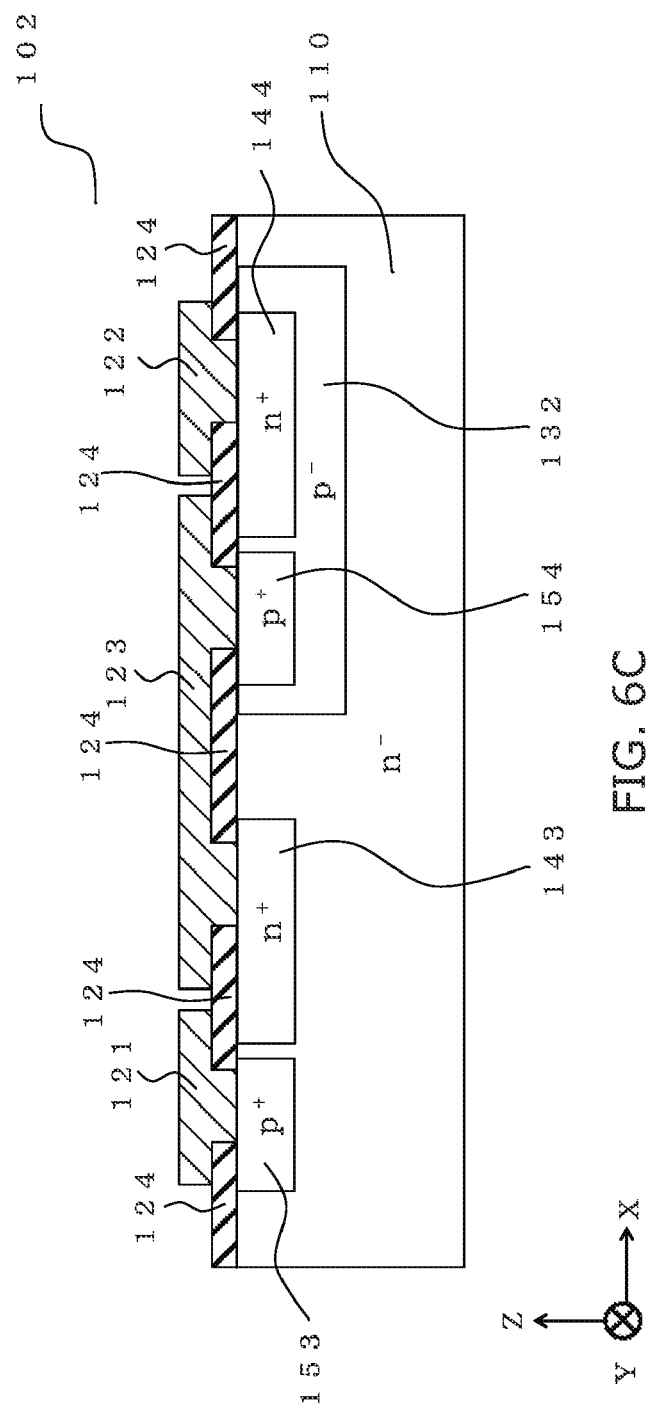
FIG. 6C is a cross-sectional view along line F-F' shown in FIG. 6A.

A semiconductor device 102 according to a second embodiment will now be described with reference to FIGS. 6A to 6C. FIG. 6A is a plan view of the semiconductor device 102 according to the second embodiment; FIG. 6B is a cross-sectional view along line E-E' shown in FIG. 6A; and FIG. 6C is a cross-sectional view along line F-F' shown in FIG. 6A. The same portions as those of the semiconductor device 100 of the first embodiment are marked with the same reference numerals.

The semiconductor device 102 according to the second embodiment differs from the semiconductor device 100 according to the first embodiment in that the interface between the first cathode region 141 and the first anode region 151, the interface between the second cathode region 142 and the second anode region 152, the interface between the third cathode region 143 and the third anode region 153, and the interface between the fourth cathode region 144 and the fourth anode region 154 each are formed in comb shapes.

Specifically, when the semiconductor device 102 is viewed in plan, a portion of the first cathode region 141 is interposed between portions of the first anode region 151 in the Y-direction; and a portion of the first anode region 151 is interposed between portions of the first cathode region 141 in the Y-direction. Similarly, a portion of the second cathode region 142 is interposed between portions of the second anode region 152 in the Y-direction; and a portion of the second anode region 152 is interposed between portions of the second cathode region 142 in the Y-direction. Also, a portion of the third cathode region 143 is interposed between portions of the third anode region 153; and a portion of the third anode region 153 is interposed between portions of the third cathode region 143. Also, a portion of the fourth cathode region 144 is interposed between portions of the fourth anode region 154; and a portion of the fourth anode region 154 is interposed between portions of the fourth cathode region 144.

Thereby, compared to the semiconductor device 100 according to the first embodiment described above, the junction area of the interface is increased between the cathode region and the anode region in the diodes D1 to D4 of the semiconductor device 102. As a result, the surface area through which the current can flow is greater than that of the semiconductor device 100; therefore, the dynamic resistance can be further reduced.

Although the first conductivity type is the n-type and the second conductivity type is the p-type in the description of the second embodiment described above as well, similar effects can be obtained by setting the first conductivity type to be the p-type and the second conductivity type to be the n-type. According to the second embodiment as well, similar effects can be obtained by providing the second cathode region 142 and the second anode region 152 in the first semiconductor region 131 and by providing the third cathode region 143 and the third anode region 153 in the second semiconductor region 132 as in the modification of the first embodiment.

Third Embodiment

Figure 7A:
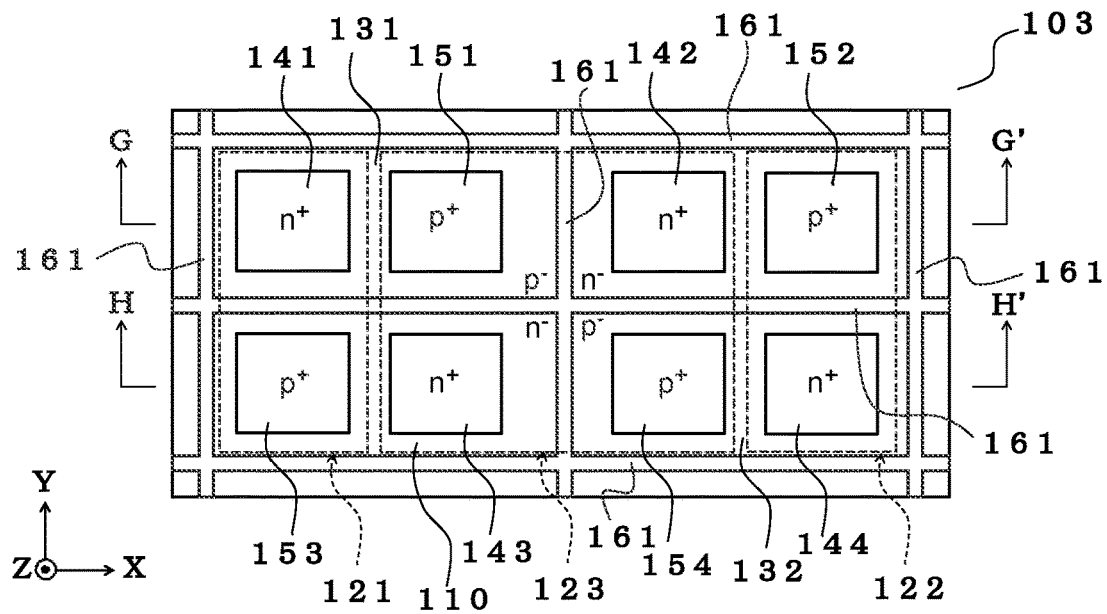
FIG. 7A is a plan view of a semiconductor device 103 according to a third embodiment.
Figure 7B:
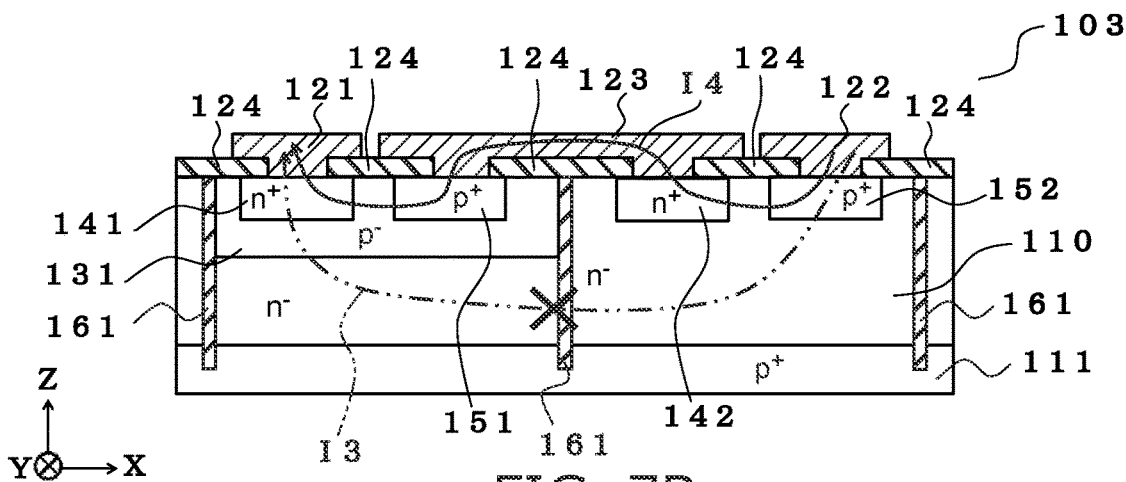
FIG. 7B is a cross-sectional view along line G-G' shown in FIG. 7A.
Figure 7C:
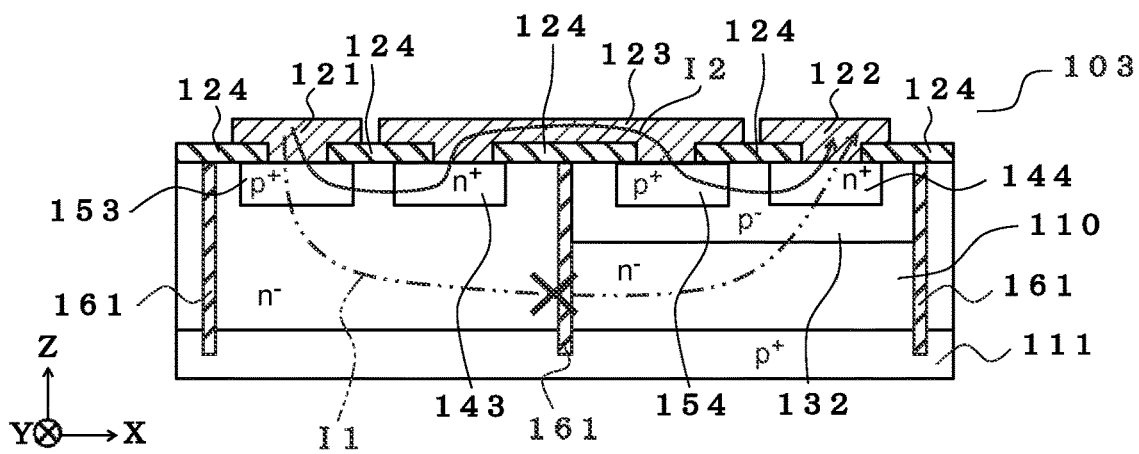
FIG. 7C is a cross-sectional view along line H-H' shown in FIG. 7A.

A semiconductor device 103 according to a third embodiment will now be described with reference to FIGS. 7A to 7C. FIG. 7A is a plan view of the semiconductor device 103 according to the third embodiment; FIG. 7B is a cross-sectional view along line G-G' shown in FIG. 7A; and FIG. 7C is a cross-sectional view along line H-H' shown in FIG. 7A. The same portions as the semiconductor device 100 of the first embodiment are marked with the same reference numerals.

As shown in FIGS. 7A to 7C, the semiconductor device 103 according to the embodiment includes a p$^+$-type semiconductor substrate 111 and an element separation insulating body 161 in addition to the configuration of the semiconductor device 100 according to the first embodiment. The n$^-$-type semiconductor layer 110 is located on the p$^+$-type semiconductor substrate 111 and contacts the semiconductor substrate 111. The element separation insulating body 161 is formed by filling an insulating material such as silicon oxide, etc., into a deep trench. The upper end of the element separation insulating body 161 contacts the insulating layer 124; and the lower end of the element separation insulating body 161 is positioned in the semiconductor substrate 111.

The element separation insulating body 161 has a lattice shape when viewed along the Z-direction, and surrounds the regions of the diodes. In other words, when viewed along the Z-direction, the element separation insulating body 161 surrounds the first cathode region 141, the first semiconductor region 131, and the first anode region 151 that are included in the diode D1. Similarly, the element separation insulating body 161 surrounds the second cathode region 142 and the second anode region 152 that are included in the diode D2. The element separation insulating body 161 also surrounds the third cathode region 143 and the third anode region 153 that are included in the diode D3. The element separation insulating body 161 also surrounds the fourth cathode region 144, the second semiconductor region 132, and the fourth anode region 154 that are included in the diode D4. It is sufficient for the element separation insulating body 161 to be located between the diode D1 and the diode D2 and between the diode D3 and the diode D4; and the element separation insulating body 161 may not always surround the diodes.

Effects of the third embodiment will now be described.

According to the embodiment, a leakage current that flows through the n$^-$-type semiconductor layer 110 can be suppressed by providing the element separation insulating body 161 between the regions of the diodes. In other words, as shown as a virtual current path I1 in FIG. 7C, after the current is input to the first electrode 121 and flows into the semiconductor layer 110 via the third anode region 153, the current can be prevented from subsequently flowing through the semiconductor layer 110 and flowing from the semiconductor layer 110 to the second electrode 122 via the second semiconductor region 132 and the fourth cathode region 144 without flowing through the third cathode region 143 and the fourth anode region 154. Thereby, as shown as a current path I2 in FIG. 7C, the current that is input to the first electrode 121 flows more easily to the second electrode 122 via the third anode region 153, the semiconductor layer 110, the third cathode region 143, the third electrode 123, the fourth anode region 154, the second semiconductor region 132, and the fourth cathode region 144.

Similarly, as shown as a virtual current path I3 in FIG. 7B, the current that is input to the second electrode 122 and flows into the semiconductor layer 110 via the second anode region 152 can be prevented from subsequently flowing through the semiconductor layer 110 and flowing from the semiconductor layer 110 to the first electrode 121 via the first semiconductor region 131 and the first cathode region 141 without flowing through the second cathode region 142 and the first anode region 151. Thereby, as shown as a current path I4 in FIG. 7B, the current that is input to the second electrode 122 more easily flows to the first electrode 121 via the second anode region 152, the semiconductor layer 110, the second cathode region 142, the third electrode 123, the first anode region 151, the first semiconductor region 131, and the first cathode region 141.

Thus, according to the embodiment, the leakage current of the semiconductor device 103 can be reduced. As a result, a breakdown voltage of the semiconductor device 103 can be suppressed to be less than the design value.

Modification of Third Embodiment

Figure 8A:
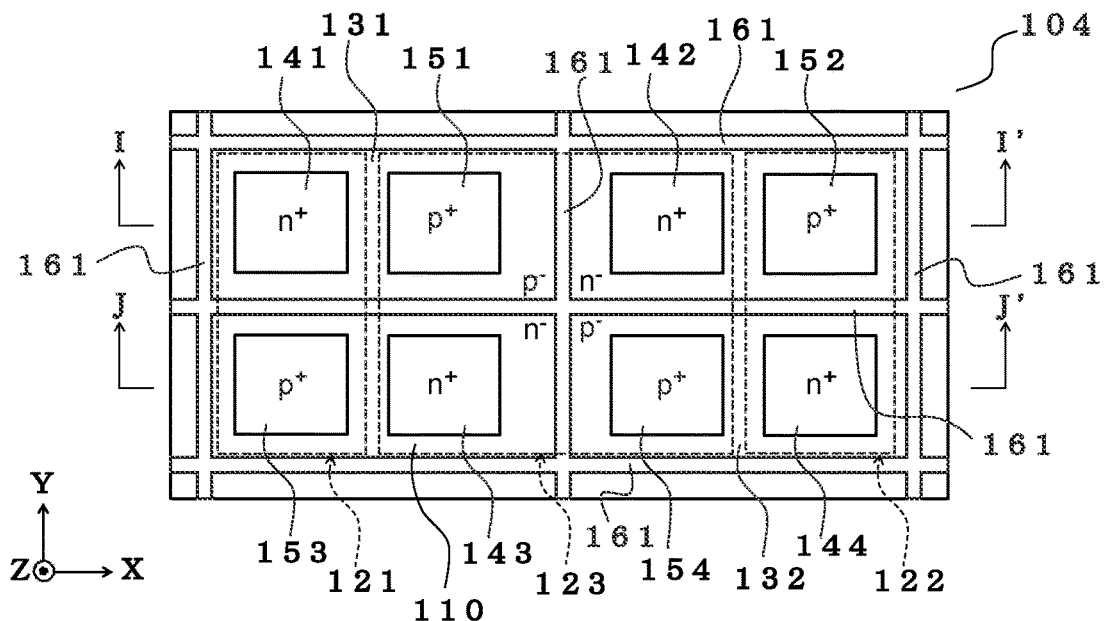
FIG. 8A is a plan view of a semiconductor device 104 according to a modification of the third embodiment.
Figure 8B:
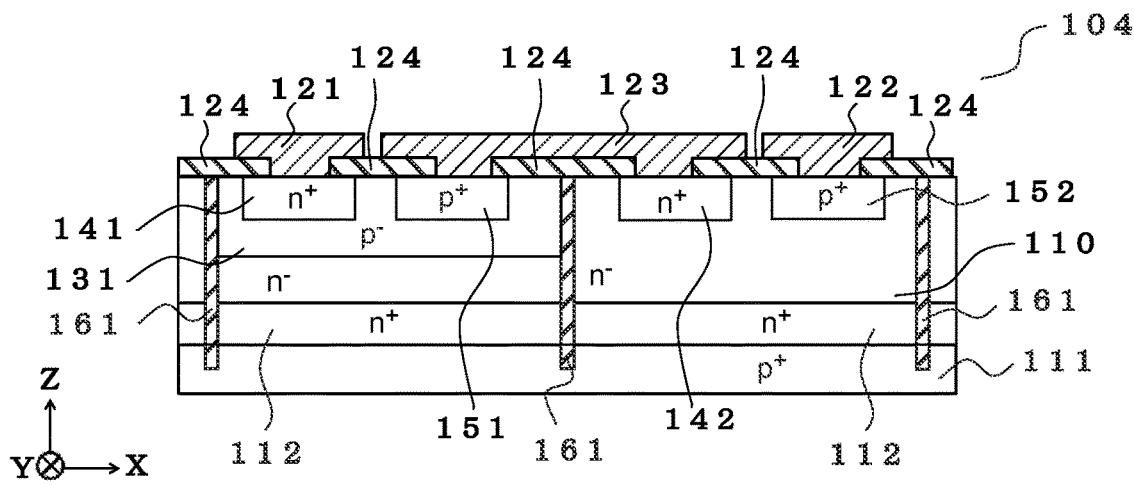
FIG. 8B is a cross-sectional view along line I-I' shown in FIG. 8A.
Figure 8C:
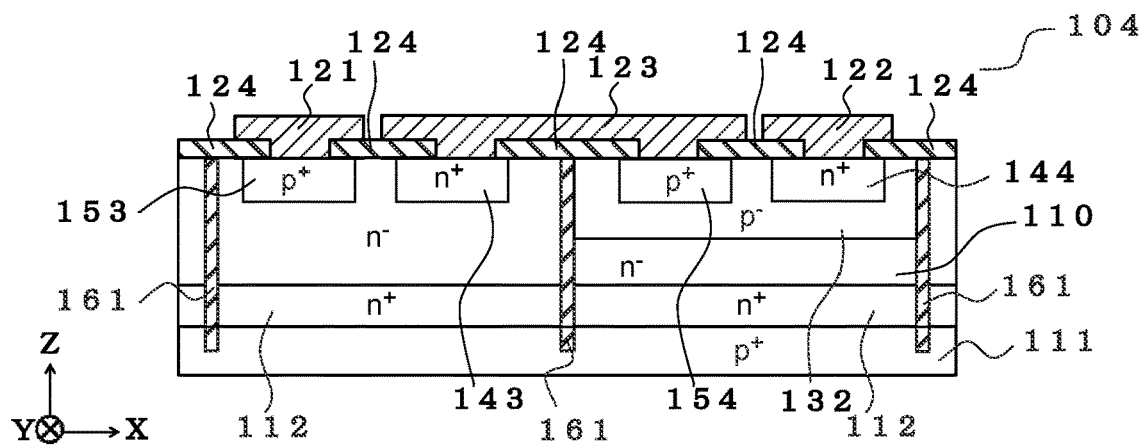
FIG. 8C is a cross-sectional view along line J-J' shown in FIG. 8A.

A semiconductor device 104 according to a modification of the third embodiment will now be described with reference to FIGS. 8A to 8C. FIG. 8A is a plan view of the semiconductor device 104 according to the modification of the third embodiment; FIG. 8B is a cross-sectional view along line I-I' shown in FIG. 8A; and FIG. 8C is a cross-sectional view along line J-J' shown in FIG. 8A. The same portions as the semiconductor device 103 of the third embodiment are marked with the same reference numerals.

As shown in FIGS. 8A to 8C, the semiconductor device 104 according to the modification includes an n$^+$-type buried diffusion layer 112 in addition to the configuration of the semiconductor device 103 according to the third embodiment. The buried diffusion layer 112 is located between the p$^+$-type semiconductor substrate 111 and the n$^-$-type semiconductor layer 110 and contacts the semiconductor substrate 111 and the semiconductor layer 110. Therefore, the semiconductor layer 110 is separated from the semiconductor substrate 111 by the buried diffusion layer 112. The element separation insulating body 161 extends through the buried diffusion layer 112 along the Z-direction.

According to the modification, because a p-n interface is formed between the p$^+$-type semiconductor substrate 111 and the n$^+$-type buried diffusion layer 112, the current that is input from the first electrode 121 or the second electrode 122 is prevented from flowing into the semiconductor substrate 111; and the leakage current that flows through the semiconductor substrate 111 can be suppressed. The leakage current can be even further reduced thereby.

Fourth Embodiment

Figure 9A:
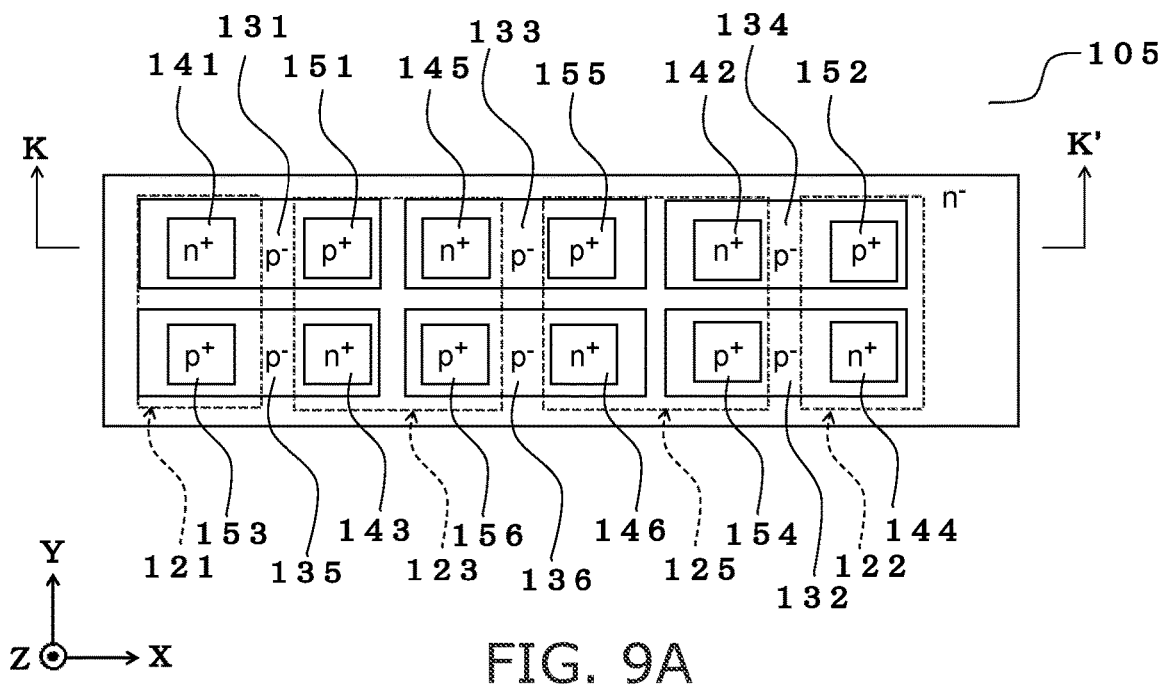
FIG. 9A is a plan view of a semiconductor device 105 according to a fourth embodiment.
Figure 9B:
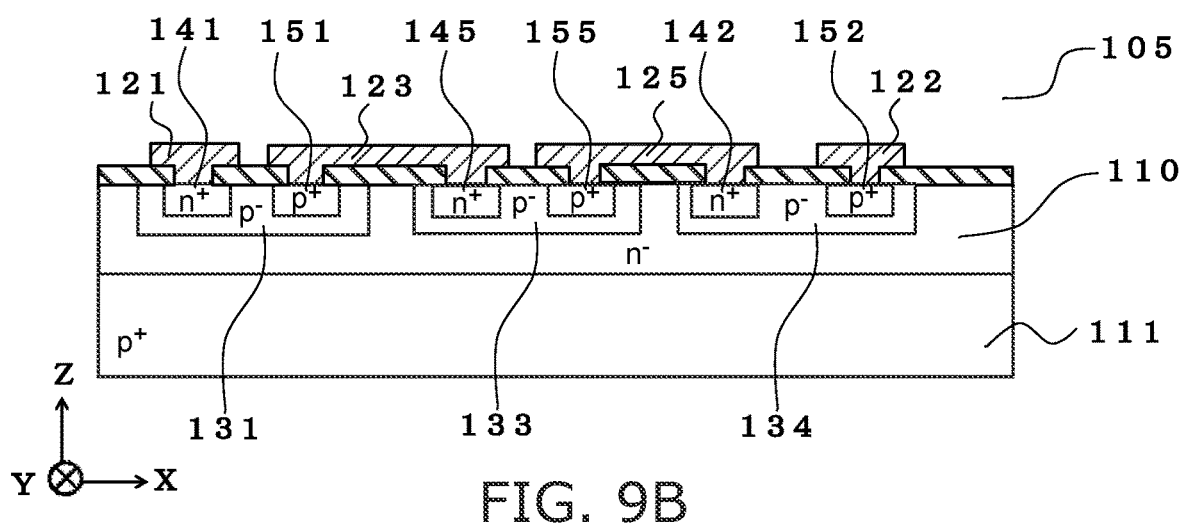
FIG. 9B is a cross-sectional view along line K-K' shown in FIG. 9A.
Figure 10:
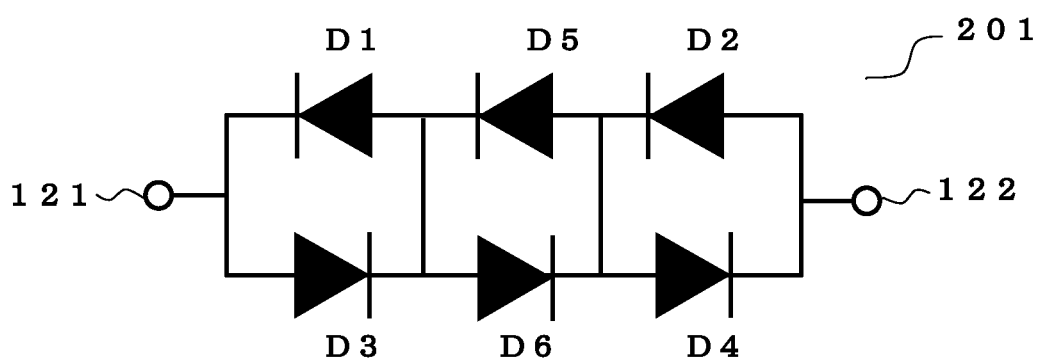
FIG. 10 is an equivalent circuit 201 of the semiconductor device 105 according to the fourth embodiment.

A semiconductor device 105 according to a fourth embodiment will now be described with reference to FIGS. 9A and 9B and FIG. 10. FIG. 9A is a plan view of the semiconductor device 105 according to the fourth embodiment; and FIG. 9B is a cross-sectional view along line K-K' shown in FIG. 9A. FIG. 10 is an equivalent circuit diagram showing the equivalent circuit 201 of the semiconductor device 105 according to the fourth embodiment. The same portions as the semiconductor device 100 of the first embodiment are marked with the same reference numerals.

As shown in FIGS. 9A and 9B and FIG. 10, the fourth embodiment is an example in which the number of diodes connected in series is greater than that of the first embodiment. The semiconductor device 105 according to the fourth embodiment includes a p$^-$-type third semiconductor region 133, a p$^-$-type fourth semiconductor region 134, a p$^-$-type fifth semiconductor region 135, and a p$^-$-type sixth semiconductor region 136 in the upper layer portion of the n$^-$-type semiconductor layer 110 in addition to the first and second semiconductor regions 131 and 132. Also, an n$^+$-type fifth cathode region 145 and an n$^+$-type sixth cathode region 146 are included in addition to the first to fourth cathode regions 141 to 144. Similarly, a p$^+$-type fifth anode region 155 and a p$^+$-type sixth anode region 156 are included in addition to the first to fourth anode regions 151 to 154. A fourth electrode 125 is located on the semiconductor layer 110 in addition to the first electrode 121, the second electrode 122, and the third electrode 123.

The positional relationship of the portions will now be described.

The first semiconductor region 131, the third semiconductor region 133, and the fourth semiconductor region 134 are arranged to be separated from each other in this order along the X-direction. The fifth semiconductor region 135, the sixth semiconductor region 136, and the second semiconductor region 132 also are arranged to be separated from each other in this order along the X-direction. The fifth semiconductor region 135 and the first semiconductor region 131 are arranged to be separated from each other along the Y-direction. The sixth semiconductor region 136 and the third semiconductor region 133 are arranged to be separated from each other along the Y-direction. The second semiconductor region 132 and the fourth semiconductor region 134 are arranged to be separated from each other along the Y-direction. Thus, the first to sixth semiconductor regions are arranged in a matrix configuration of two rows along the Y-direction and three columns along the X-direction.

The first cathode region 141 and the first anode region 151 are located in the upper layer portion of the first semiconductor region 131 and are included in the diode D1. The second cathode region 142 and the second anode region 152 are located in the upper layer portion of the fourth semiconductor region 134 and are included in the diode D2. The third cathode region 143 and the third anode region 153 are located in the upper layer portion of the fifth semiconductor region 135 and are included in the diode D3. The fourth cathode region 144 and the fourth anode region 154 are located in the upper layer portion of the second semiconductor region 132 and are included in the diode D4. The fifth cathode region 145 and the fifth anode region 155 are located in the upper layer portion of the third semiconductor region 133 and are included in the diode D5. The sixth cathode region 146 and the sixth anode region 156 are located in the upper layer portion of the sixth semiconductor region 136 and are included in the diode D6.

The fourth electrode 125 is located between the second electrode 122 and the third electrode 123. Thereby, the first electrode 121, the third electrode 123, the fourth electrode 125, and the second electrode 122 are arranged to be separated from each other in this order along the X-direction on the semiconductor layer 110. The first electrode 121 is connected to the first cathode region 141 and the third anode region 153. The third electrode 123 is connected to the first anode region 151, the third cathode region 143, the fifth cathode region 145, and the sixth anode region 156. The fourth electrode 125 is connected to the fifth anode region 155, the sixth cathode region 146, the second cathode region 142, and the fourth anode region 154. The second electrode 122 is connected to the second anode region 152 and the fourth cathode region 144.

Thereby, as shown in FIG. 10, the diode D2, the diode D5, and the diode D1 are connected in series in the forward direction in this order from the second electrode 122 toward the first electrode 121. The diode D3, the diode D6, and the diode D4 are connected in series in the forward direction in this order from the first electrode 121 toward the second electrode 122. Thus, in the semiconductor device 105, three stages of diodes are connected in series between the first electrode 121 and the second electrode 122 in each of the forward direction and the reverse direction.

Effects of the fourth embodiment will now be described.

According to the semiconductor device 105 according to the fourth embodiment, compared to the semiconductor device 100 according to the first embodiment, the number of diodes connected in series between the first electrode 121 and the second electrode 122 can be increased from 2 to 3. Compared to the first embodiment, the breakdown voltage of the entire semiconductor device 105 can be increased thereby.

Thus, the number of diodes connected in series can be arbitrarily selected according to the necessary breakdown voltage of the semiconductor device. Accordingly, the design freedom of the semiconductor device can be increased. When expressed more generally, it is sufficient for the number of p$^-$-type semiconductor regions to be (2×N), and to provide one anode region and one cathode region in each semiconductor region, wherein the number of diodes in series is N (N being an integer that is not less than 2), and the number of electrodes is (N+1).

According to the fourth embodiment as well, the p-type and the n-type may be interchanged. Also, similarly to the third embodiment, the element separation insulating body 161 may be provided. Similarly to the modification of the third embodiment, the buried diffusion layer 112 may be provided.

Fifth Embodiment

Figure 11A:
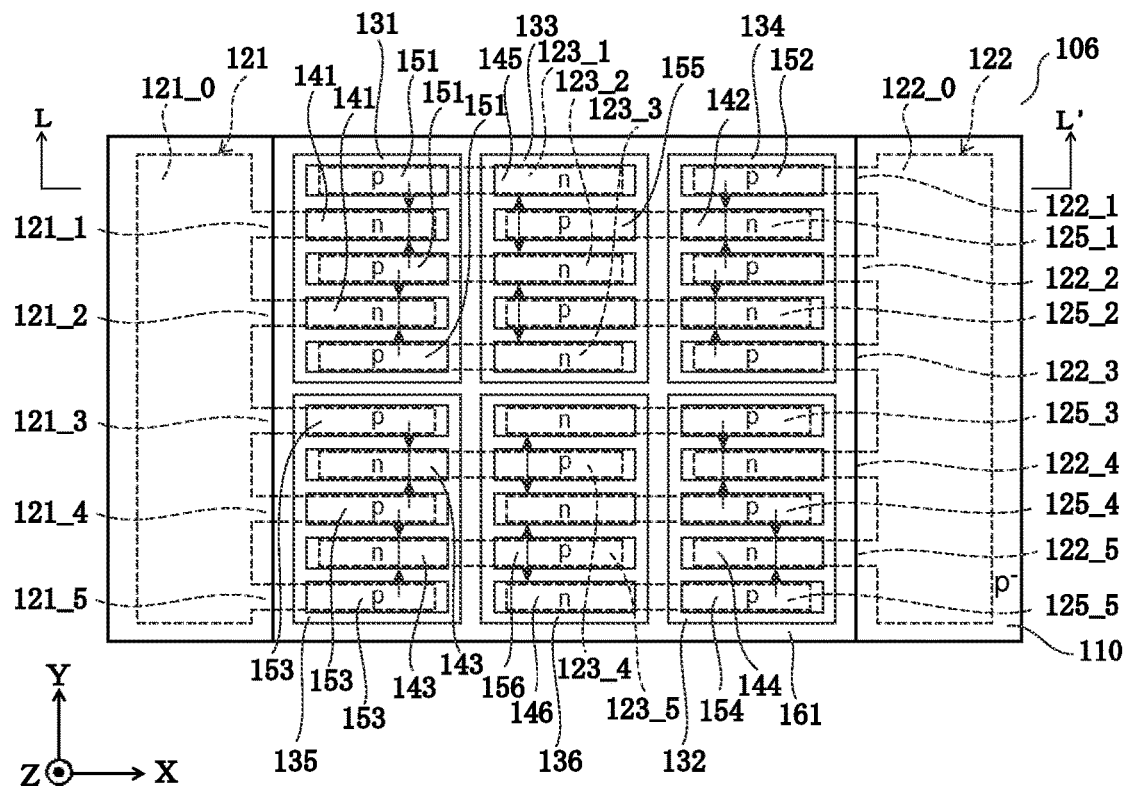
FIG. 11A is a plan view of a semiconductor device 106 according to a fifth embodiment.
Figure 11B:
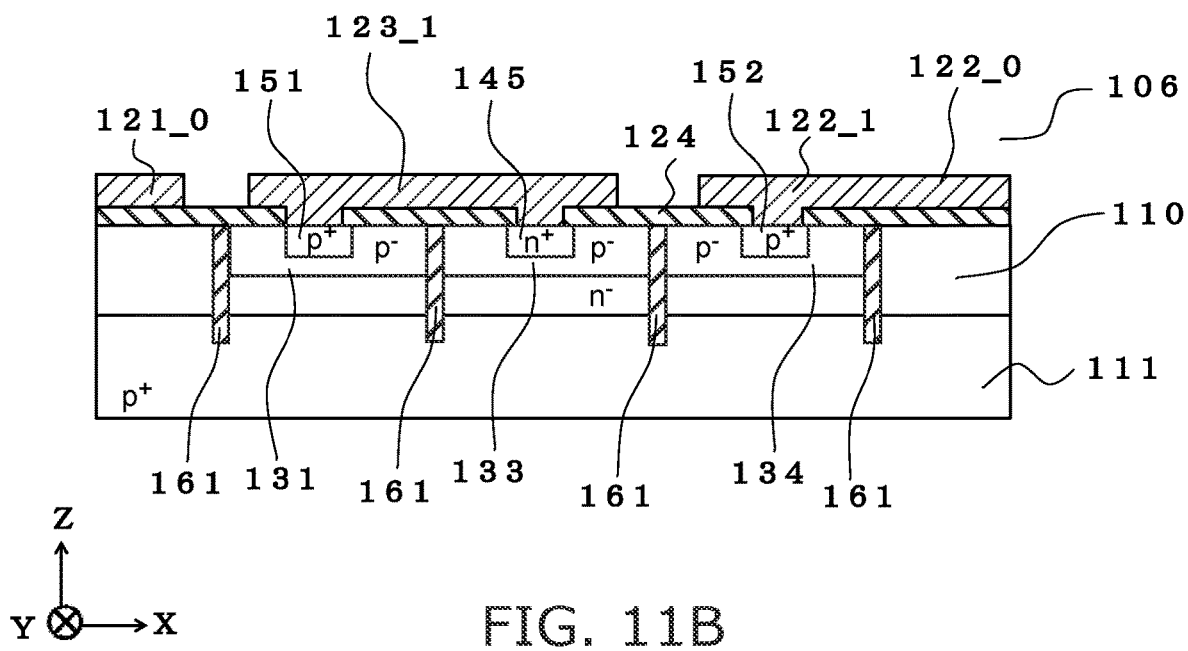
FIG. 11B is a cross-sectional view along line L-L' shown in FIG. 11A.
Figure 12A:
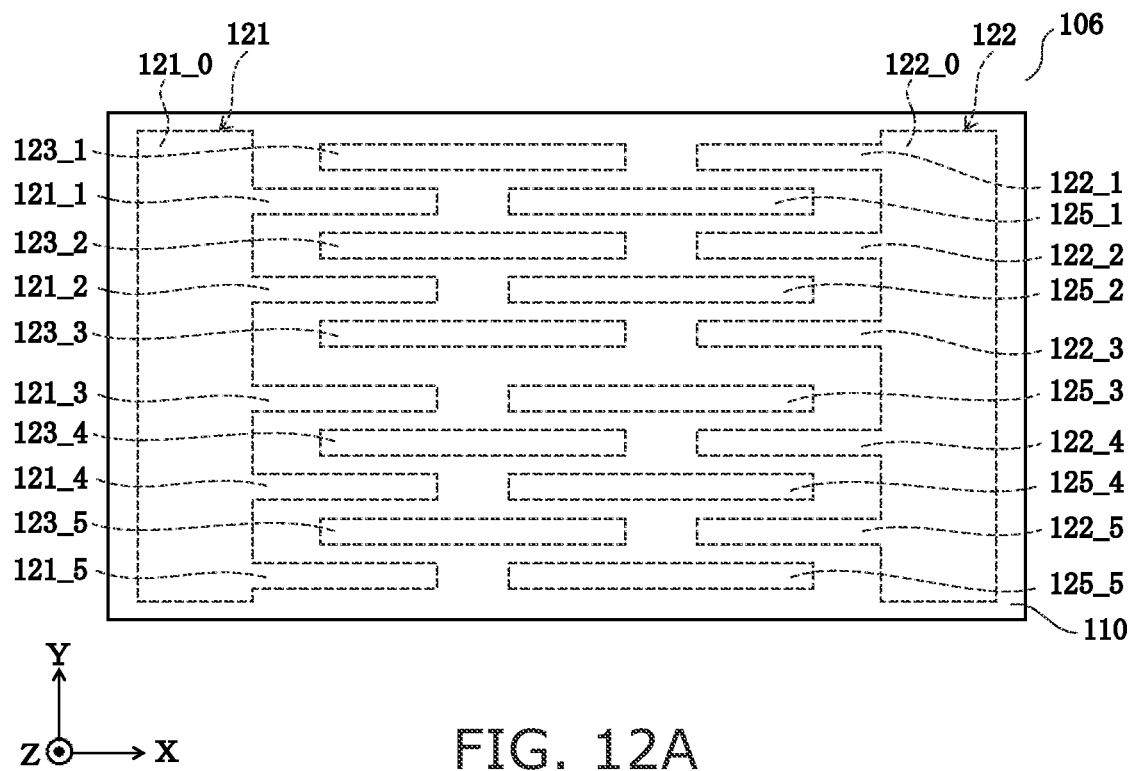
FIG. 12A is a plan view showing only a semiconductor layer 110 and the electrodes of FIG. 11A.
Figure 12B:
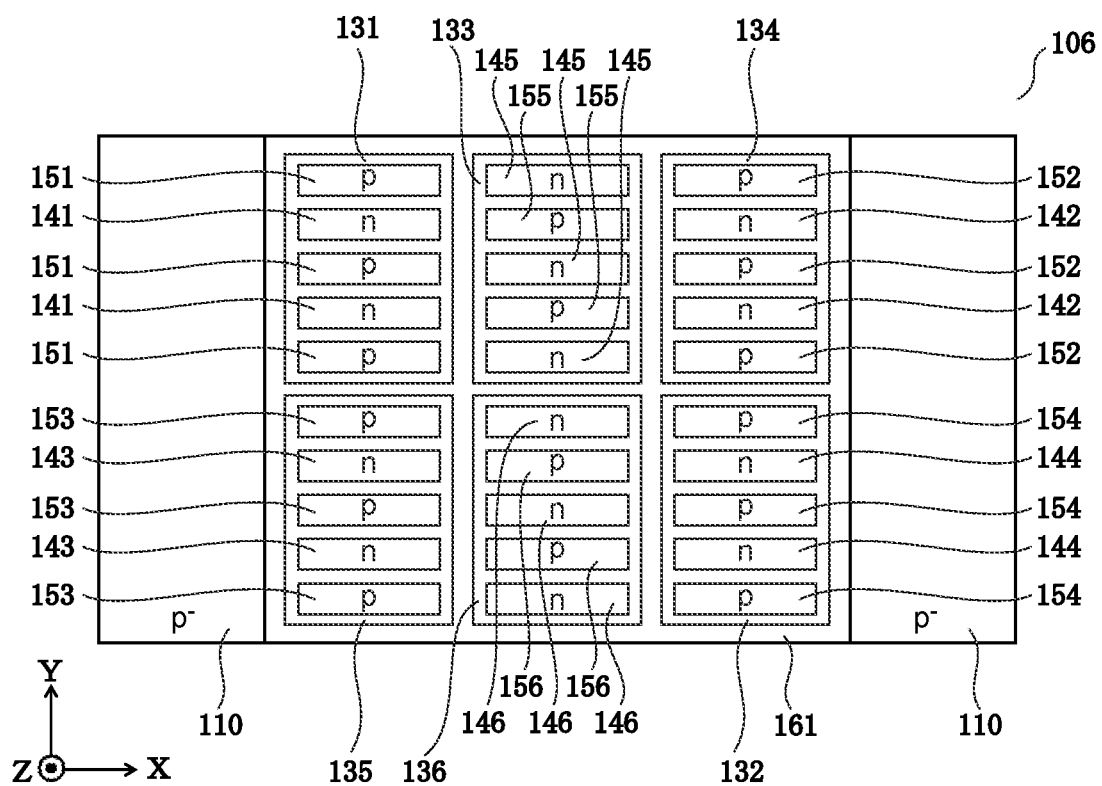
FIG. 12B is a plan view of FIG. 11A in which the electrodes are not illustrated.

A semiconductor device 106 according to a fifth embodiment will now be described with reference to FIGS. 11A and 11B. FIG. 11A is a plan view of the semiconductor device 106 according to the fifth embodiment; and FIG. 11B is a cross-sectional view along line L-L' shown in FIG. 11A. FIG. 12A is a plan view showing only the semiconductor layer 110 and the electrodes of FIG. 11A; and FIG. 12B is a plan view of FIG. 11A in which the electrodes are not illustrated. The same portions as the semiconductor device 105 of the fourth embodiment are marked with the same reference numerals.

The semiconductor device 106 according to the fifth embodiment as shown in FIGS. 11A to 12B differs from the semiconductor device 105 according to the fourth embodiment in that the first electrode 121 and the second electrode 122 are comb-shaped; multiple third electrodes 123 and multiple fourth electrodes 125 are arranged in the Y-direction; and the anode regions and the cathode regions that are included in the diodes are arranged in the Y-direction.

The first electrode 121 includes a base 121_0 extending in the Y-direction, and M (M being an integer that is not less than 2) protrusions 121_k (k being an integer of 1 to M) extending in the X-direction from the base 121_0 toward the second electrode 122. Similarly, the second electrode 122 includes a base 122_0 extending in the Y-direction, and M protrusions 122_k extending in the opposite direction of the X-direction from the base 122_0 toward the first electrode 121. M third electrodes 123 are arranged along the Y-direction. Hereinbelow, the third electrode 123 also is called the third electrode 123_k. Also, M fourth electrodes 125 are arranged along the Y-direction. Hereinbelow, the fourth electrode 125 also is called the fourth electrode 125_k. M is 5 in the example shown in FIGS. 11A and 11B.

The protrusions 121_k of the first electrode 121 and the fourth electrodes 125_k are arranged along the X-direction. The third electrodes 123_k and the protrusions 122_k of the second electrode 122 are arranged along the X-direction. The protrusions of the first electrode 121 and the portions of the third electrode 123 at the first electrode 121 side are alternately arranged along the Y-direction. The portions of the third electrode 123 at the second electrode 122 side and the portions of the fourth electrode 125 at the first electrode 121 side are alternately arranged along the Y-direction. The portions of the fourth electrode 125 at the second electrode 122 side and the protrusions of the second electrode 122 are alternately arranged along the Y-direction.

Similarly to the fourth embodiment, the p⁻-type first semiconductor region 131, the second semiconductor region 132, the third semiconductor region 133, the fourth semiconductor region 134, the fifth semiconductor region 135, and the sixth semiconductor region 136 are arranged in a matrix configuration of two rows and three columns in the upper layer portion of the n⁻-type semiconductor layer 110.

The first cathode regions 141 are located respectively in the regions directly under the protrusions 121_k of the first electrode 121 in the upper layer portion of the first semiconductor region 131. In the example shown in FIGS. 11A and 11B, the first cathode regions 141 are located respectively in the regions directly under the protrusions 121_1 and 121_2. The third anode regions 153 are located respectively in the regions directly under the protrusions 121_k of the first electrode 121 in the upper layer portion of the fifth semiconductor region 135. In the example shown in FIGS. 11A and 11B, the third anode regions 153 are located respectively in the regions directly under the protrusions 121_3, 121_4, and 121_5.

The first anode regions 151 are located respectively in the regions directly under the third electrodes 123_k in the upper layer portion of the first semiconductor region 131. In the example shown in FIGS. 11A and 11B, the first anode regions 151 are located respectively in the regions directly under the third electrodes 123_1, 123_2, and 123_3. The third cathode regions 143 are located respectively in the regions directly under the third electrodes 123_k in the upper layer portion of the fifth semiconductor region 135. In the example shown in FIGS. 11A and 11B, the third cathode regions 143 are located respectively in the regions directly under the third electrodes 123_4 and 123_5.

The fifth cathode regions 145 are located respectively in the regions directly under the third electrodes 123_k in the upper layer portion of the third semiconductor region 133. In the example shown in FIGS. 11A and 11B, the fifth cathode regions 145 are located respectively in the regions directly under the third electrodes 123_1, 123_2, and 123_3. The sixth anode regions 156 are located respectively in the regions directly under the third electrodes 123_k in the upper layer portion of the sixth semiconductor region 136. In the example shown in FIGS. 11A and 11B, the sixth anode regions 156 are located respectively in the regions directly under the third electrodes 123_4 and 123_5.

The fifth anode regions 155 are located respectively in the regions directly under the fourth electrodes 125_k in the upper layer portion of the third semiconductor region 133. In the example shown in FIGS. 11A and 11B, the fifth anode regions 155 are located respectively in the regions directly under the fourth electrodes 125_1 and 125_2. The sixth cathode regions 146 are located respectively in the regions directly under the fourth electrodes 125_k in the upper layer portion of the sixth semiconductor region 136. In the example shown in FIGS. 11A and 11B, the sixth cathode regions 146 are located respectively in the regions directly under the fourth electrodes 125_3, 125_4, and 125_5.

The second cathode regions 142 are located respectively in the regions directly under the fourth electrodes 125_k in the upper layer portion of the fourth semiconductor region 134. In the example shown in FIGS. 11A and 11B, the second cathode regions 142 are located respectively in the regions directly under the fourth electrodes 125_1 and 125_2. The fourth anode regions 154 are located respectively in the regions directly under the fourth electrodes 125_k in the upper layer portion of the second semiconductor region 132. In the example shown in FIGS. 11A and 11B, the fourth anode regions 154 are located respectively in the regions directly under the fourth electrodes 125_3, 125_4, and 125_5.

The second anode regions 152 are located respectively in the regions directly under the protrusions 122_k of the second electrode 122 in the upper layer portion of the fourth semiconductor region 134. In the example shown in FIGS. 11A and 11B, the second anode regions 152 are located respectively in the regions directly under the protrusions 122_1, 122_2, and 122_3. The fourth cathode regions 144 are located respectively in the regions directly under the protrusions 122_k of the second electrode 122 in the upper layer portion of the second semiconductor region 132. In the example shown in FIGS. 11A and 11B, the fourth cathode regions 144 are located respectively in the regions directly under the protrusions 122_4 and 122_5.

The element separation insulating body 161 has a lattice shape when viewed along the Z-direction, and surrounds the first semiconductor region 131, the second semiconductor region 132, the third semiconductor region 133, the fourth semiconductor region 134, the fifth semiconductor region 135, and the sixth semiconductor region 136.

The diodes each are formed of an anode region and a cathode region that are next to each other in the Y-direction in each semiconductor region thereby. As a result, an equivalent circuit similar to the equivalent circuit shown in FIG. 10 is realized in the semiconductor device 106.

According to the semiconductor device 106 according to the embodiment, the anode regions and the cathode regions that are included in the diodes can be arranged along the Y-direction; therefore, the length in the X-direction of the semiconductor device 106 can be shortened. When it is desirable to increase the breakdown voltage of the semiconductor device 106, the length in the X-direction of the semiconductor device 106 is increased by arranging intermediate electrodes such as the third and fourth electrodes 123 and 125 along the X-direction. On the other hand, when it is desirable to reduce the resistance of the semiconductor device 106, the value of M described above is increased, and the length in the Y-direction of the semiconductor device 106 is increased.

According to embodiments, a semiconductor device can be provided in which the internal resistance and the voltage when operating can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a semiconductor layer of a first conductivity type;
    a first electrode located on the semiconductor layer;
    a second electrode located on the semiconductor layer;
    a third electrode located on the semiconductor layer between the first electrode and the second electrode, the third electrode being separated from the first electrode and the second electrode;
    a first semiconductor region located in the semiconductor layer, the first semiconductor region being of a second conductivity type;
    a first cathode region located in the first semiconductor region, the first cathode region being of the first conductivity type and being connected with the first electrode;
    a first anode region located in the first semiconductor region, the first anode region being of the second conductivity type and being connected with the third electrode;
    a second cathode region located in the semiconductor layer, the second cathode region being of the first conductivity type, being separated from the first semiconductor region in a first direction, and being connected with the third electrode, the first direction being from the first electrode toward the second electrode;
    a second anode region located in the semiconductor layer, the second anode region being of the second conductivity type and being connected with the second electrode;
    a third anode region located in the semiconductor layer, the third anode region being of the second conductivity type and being connected with the first electrode;
    a third cathode region located in the semiconductor layer, the third cathode region being of the first conductivity type and being connected with the third electrode;
    a second semiconductor region located in the semiconductor layer, the second semiconductor region being of the second conductivity type;
    a fourth anode region located in the second semiconductor region, the fourth anode region being of the second conductivity type and being connected with the third electrode; and
    a fourth cathode region located in the second semiconductor region, the fourth cathode region being of the first conductivity type and being connected with the second electrode,
    wherein the first cathode region and the third anode region are arranged in a second direction crossing the first direction, and
    wherein the second semiconductor region is separated from the first semiconductor region in both the first direction and the second direction.

2. The device according to claim 1, wherein
    an impurity concentration of the semiconductor layer is less than impurity concentrations of the first cathode region, the second cathode region, the third cathode region, and the fourth cathode region, and
    impurity concentrations of the first semiconductor region and the second semiconductor region are less than impurity concentrations of the first anode region, the second anode region, the third anode region, and the fourth anode region.

3. The device according to claim 1, wherein
    at least one pair of regions is alternately positioned in the second direction crossing the first direction, and
    the at least one pair of regions includes a portion of the first anode region and a portion of the first cathode region, a portion of the second anode region and a portion of the second cathode region, a portion of the third anode region and a portion of the third cathode region, and/or a portion of the fourth anode region and a portion of the fourth cathode region.

4. The device according to claim 1, further comprising:
    an element separation insulating body located between the second cathode region and the first anode region and between the third cathode region and the fourth anode region.

5. The device according to claim 4, further comprising:
    a semiconductor substrate of the second conductivity type,
    the semiconductor layer being located on the semiconductor substrate,
    a lower end of the element separation insulating body being located in the semiconductor substrate.

6. The device according to claim 5, further comprising:
    a buried diffusion layer located between the semiconductor substrate and the semiconductor layer,
    the buried diffusion layer being of the first conductivity type and having an impurity concentration higher than the impurity concentration of the semiconductor layer.

* * * * *